(12) United States Patent
Di Stefano

(10) Patent No.: US 7,601,009 B2
(45) Date of Patent: Oct. 13, 2009

(54) SOCKET FOR AN ELECTRONIC DEVICE

(75) Inventor: Thomas H. Di Stefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 0 days.

(21) Appl. No.: 11/654,439

(22) Filed: Jan. 17, 2007

(65) Prior Publication Data

US 2007/0269999 A1    Nov. 22, 2007

Related U.S. Application Data

(60) Provisional application No. 60/801,304, filed on May 18, 2006.

(51) Int. Cl.
    *H01R 12/00*    (2006.01)
(52) U.S. Cl. .................................................. 439/73
(58) Field of Classification Search ............. 439/73–71, 439/66, 65, 70
    See application file for complete search history.

(56) References Cited

U.S. PATENT DOCUMENTS

| | | | |
|---|---|---|---|
| 3,676,776 A | 7/1972 | Bauer et al. ............... 324/72.5 |
| 4,413,874 A | 11/1983 | Williams .................... 339/151 |
| 4,574,236 A | 3/1986 | Hechtman .................. 324/158 |
| 4,668,041 A | 5/1987 | La Komski et al. ......... 339/108 |
| 4,837,507 A | 6/1989 | Hechtman .................. 324/158 |
| 4,947,111 A | 8/1990 | Higman et al. ............. 324/158 |
| 5,003,255 A | 3/1991 | Kazama ..................... 324/158 |
| 5,174,763 A * | 12/1992 | Wilson ........................ 439/66 |
| 5,414,369 A * | 5/1995 | Kazama ...................... 324/758 |
| 5,877,554 A * | 3/1999 | Murphy ...................... 257/727 |
| 5,990,697 A | 11/1999 | Kazama ...................... 324/761 |
| 5,993,269 A | 11/1999 | Ito .............................. 439/824 |
| 6,046,597 A * | 4/2000 | Barabi ........................ 324/755 |
| 6,074,219 A * | 6/2000 | Tustaniwskyj et al. ......... 439/66 |
| 6,098,282 A | 8/2000 | Frankeny et al. .............. 29/852 |
| 6,190,181 B1 * | 2/2001 | Affolter et al. ................ 439/70 |
| 6,264,476 B1 * | 7/2001 | Li et al. ........................ 439/66 |
| 6,323,665 B1 * | 11/2001 | Johnson et al. ............. 324/760 |
| 6,323,667 B1 | 11/2001 | Kazama ...................... 324/761 |
| 6,337,572 B1 | 1/2002 | Kazama ...................... 324/754 |
| 6,556,033 B1 * | 4/2003 | Kazama ...................... 324/761 |
| 6,561,820 B2 * | 5/2003 | Stone et al. ................... 439/70 |
| 6,638,097 B2 | 10/2003 | Wu et al. ..................... 439/482 |
| 6,642,728 B1 | 11/2003 | Kudo et al. ................. 324/754 |
| 6,655,983 B1 | 12/2003 | Ishikawa et al. ............ 439/482 |

(Continued)

*Primary Examiner*—Aexander Gilman
(74) *Attorney, Agent, or Firm*—Michael B. Einschlag

(57) ABSTRACT

One embodiment of the present invention is a socket useful to contact an electronic device, the socket including: (a) one or more contactor holder plates including one or more first through holes having a first hole cross sectional area, and one or more second through holes having a second hole cross sectional area; (b) one or more first contactors having a body with a first body cross sectional area disposed in the first through holes; (c) one or more second contactors having a body with a second body cross sectional area disposed in the second through holes; and (d) a heat sink in thermal contact with one or more of the one or more contactor holder plates; wherein a first ratio of the first hole cross sectional area to the first body cross sectional area is different from a second ratio of the second hole cross sectional area to the second body cross sectional area.

64 Claims, 8 Drawing Sheets

U.S. PATENT DOCUMENTS

| | | |
|---|---|---|
| 6,712,621 B2 | 3/2004 | Li et al. .......................... 439/65 |
| 6,846,184 B2 * | 1/2005 | Fan et al. ...................... 439/66 |
| 6,905,368 B2 | 6/2005 | Mashiyama et al. ......... 439/608 |
| 6,953,348 B2 * | 10/2005 | Yanagisawa et al. .......... 439/66 |
| 7,114,959 B2 | 10/2006 | Stone et al. ................... 439/66 |
| 7,435,102 B2 * | 10/2008 | Goodman .................... 439/70 |

* cited by examiner

SOCKET FOR AN ELECTRONIC DEVICE

This patent application relates to U.S. Provisional Application No. 60/801,304 filed May 18, 2006 from which priority is claimed under 35 USC §119(e), and which provisional application is incorporated herein in its entirety.

TECHNICAL FIELD OF THE INVENTION

One or more embodiments of the present invention relate to a socket for an electronic device such as a microelectronic device, and more particularly to a socket for supplying high current and high frequency electrical currents to high performance microelectronic devices, for example, and without limitation, integrated circuits ("ICs").

BACKGROUND OF THE INVENTION

Sockets are used widely in the electronics industry to mount and connect microelectronic devices such as semiconductor integrated circuits ("ICs") to electronics systems of various sorts—as is well known, a socket is used to connect terminals on a device to corresponding contacts on a printed circuit board or other electrical interconnection means. In addition, sockets are routinely used in systems for: (a) testing electronic device performance (an assortment of socket types have been developed to connect to a device under test ("DUT") having a wide variety of terminals and configurations), or (b) burn-in of electronic devices at elevated temperatures.

Prior art sockets are differentiated typically according to device terminals and intended end use (i.e., application). As such, sockets are typically designed to make electrical contact to microelectronic devices having specific types of device terminals—types of device terminals contacted by sockets include pin grid arrays ("PGAs"), J-leads, gull-wing leads, dual in-line ("DIP") leads, ball grid arrays ("BGAs"), column grid arrays ("CGAs"), flat metal pads ("LAN" grid arrays or "LGAs"), and many others. In order to provide sockets for microelectronic devices with this variety of terminals, many contactor technologies have been developed for sockets. In addition to the foregoing, further differentiation among prior art sockets refers to low insertion force ("LIF") sockets, zero insertion force ("ZIF") sockets, auto-load sockets, burn-in sockets, high performance test sockets, and production sockets (i.e., sockets for use in products). In further addition to the foregoing, low cost prior art sockets for burn-in and product applications typically incorporate contactors of stamped and formed springs to contact terminals on a DUT. In still further addition to the foregoing, for high pin-count prior art sockets, a cam is often used to urge device terminals laterally against corresponding contactors to make good contact to each spring while allowing a low or zero insertion force.

For specialized applications, prior art sockets have used a wide variety of contactors, including anisotropic conductive sheets, flat springs, lithographically formed springs, fuzz buttons (available from Cinch, Inc. of Lombard, Ill.), spring wires, barrel connectors, twisted wire springs in an elastomer, and spring forks, among others. Prior art sockets intended for applications where many test mating cycles (also referred to as socket mount-demount cycles) are required typically use spring pin contactors of the type exemplified by Pogo® spring contacts (available from Everett Charles Technologies of Pomona, Calif.). Spring probes for applications in the electronics test industry are available in many configurations, including simple pins and coaxially grounded pins. Most prior art spring probes consist of a helical wire spring disposed between a top post (for contacting terminals on the DUT) and a bottom post (for contacting contacts on a circuit board—a device under test board or "DUT board").

Prior art sockets typically consist of a plurality of contactors disposed in an array of apertures formed through a dielectric holder. By way of example, a high performance, prior art test socket may incorporate a plurality of Pogo® spring contacts, each of which is held in a pin holder consisting of an array of holes through a thin dielectric plate. The dielectric material in a high performance, prior art test socket is typically selected from a group of dimensionally stable polymer materials including: glass reinforced Torlon 5530 available from Quadrant Engineering Plastic Products, Inc. of Reading, Pa.; Vespel; Ultem 2000 available from GE Company GE Plastics of Pittsfield, Mass.; PEEK; liquid crystal polymer; and others. The individual Pogo® spring contacts are typically selected and designed for signal conduction at an impedance level of approximately fifty (50) ohms. In certain high performance, prior art configurations, the contactor is a coaxial type having a center spring pin with a contactor barrel body enclosed within a cylindrical, coaxial, ground shield spaced to achieve a desired signal impedance, typically fifty (50) ohms.

Materials other than dielectric sheets have been used for prior art socket bodies. For example, ceramic materials including alumina, aluminum nitride, and low temperature co-fired ceramic are used for high temperatures. In addition, insulation coated, metal socket bodies have been used to control dimensional stability over a range of temperature. In further addition, laminated bodies of alternating layers of dielectric and metal materials in thermal contact with elastomeric contactors and compliant contactors have been used.

As is well known to those of ordinary skill in the art, a primary function of prior art sockets is to provide reliable and repeatable electrical contact to microelectronic device terminals (i.e., a capability to mount and demount a device on the socket repeatedly, without causing damage to either). As such, a measure of quality is contact resistance between device terminals and corresponding contacts on a measurement system, determined as a function of a number of repeated mating cycles. For example, a high performance socket will typically provide a contact resistance of 20 milliohms or less for 10,000 mating cycles. More recently, advances in semiconductor devices are placing additional demands on IC sockets. In particular, increasing power and current levels require sockets that can supply more current per terminal. Further, at higher levels of current, the socket becomes a source of heat due to current flowing through the contact resistance of each pin. Further demands are also placed on the socket for signal performance relating to: (a) controlled impedance for signal terminals; (b) low cross talk between signal terminals; and (c) low inductance power and ground connections to a device.

In light of the above, despite the many socket technologies available in the prior art, there is a need in the art for a socket that can satisfy one or more of the above-identified demands relating to high current, low impedance power and ground connections, impedance control, and isolation of high frequency signal terminals.

SUMMARY OF THE INVENTION

One or more embodiments of the present invention satisfy one or more of the above-identified demands. In particular, one embodiment of the present invention is a socket useful to contact an electronic device, the socket comprising: (a) one or more contactor holder plates including one or more first through holes having a first hole cross sectional area, and one or more second through holes having a second hole cross sectional area; (b) one or more first contactors having a body with a first body cross sectional area disposed in the first through holes; (c) one or more second contactors having a body with a second body cross sectional area disposed in the second through holes; and (d) a heat sink in thermal contact with one or more of the one or more contactor holder plates; wherein a first ratio of the first hole cross sectional area to the first body cross sectional area is different from a second ratio of the second hole cross sectional area to the second body cross sectional area.

In addition, another embodiment of the present invention is a socket useful to contact an electronic device, the socket comprising (a) one or more electrically conductive contactor holder plates including one or more first through holes having a first hole cross sectional area, and one or more second through holes having a second hole cross sectional area; (b) one or more first contactors having a body with a first body cross sectional area disposed in the first through holes; and (c) one or more second contactors having a body with a second body cross sectional area disposed in the second through holes; wherein a ratio of the first hole cross sectional area to the first body cross sectional area is greater than 1.4 times a ratio of the second hole cross sectional area to the second body cross sectional area.

DETAILED DESCRIPTION

Figure 1A:
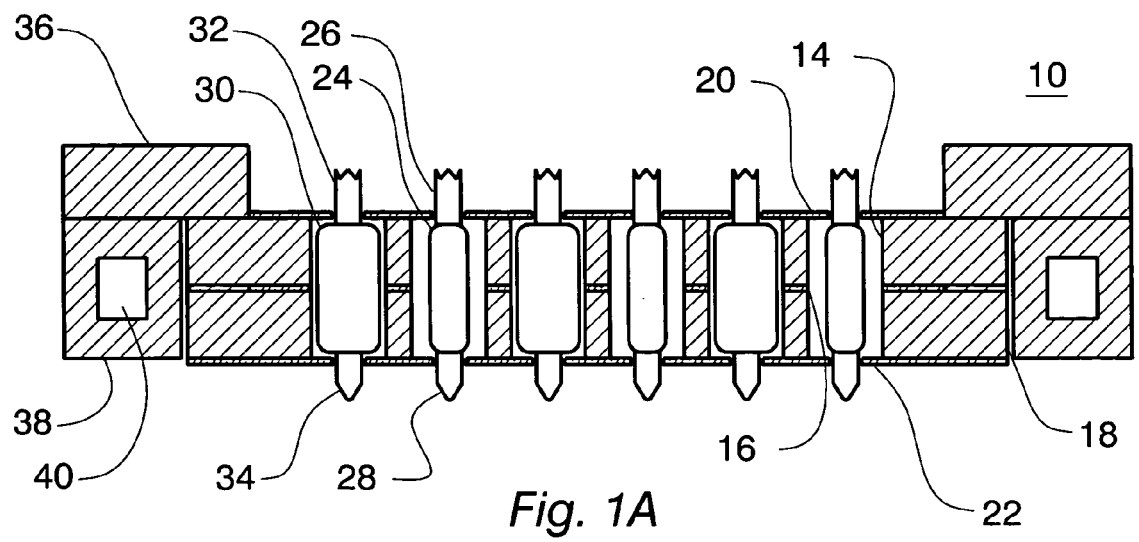
FIG. 1A shows a cross sectional view of a socket that is fabricated in accordance with one or more embodiments of the present invention.

FIG. 1A shows a cross sectional view of socket 10 that is fabricated in accordance with one or more embodiments of the present invention. In accordance with one or more embodiments of the present invention, socket 10 can be used, among other things, as a socket for contacting an integrated circuit ("IC") or other microelectronic or electronic device.

As shown in FIG. 1A, socket 10 comprises contactors in the form of a plurality of spring probes 24 and spring probes 30 that are held in circular, cylindrical through holes in contactor holder plates 14 and 18 by dielectric sheets 20 and 22. As shown in FIG. 1A, dielectric sheets 20 and 22: (a) have holes for spring pins of the spring probes (as is well known, the term spring pin refers to a pin that protrudes from a spring probe); (b) prevent spring probes 24 and spring probes 30 from making contact with contactor holder plates 14 and 18; and (c) provide insulation between socket 10 and any device or test board to which socket 10 may be contacted. As further shown in FIG. 1A: (a) spring pins 26 and 28 of spring probes 24 and spring pins 32 and 34 of spring probes 30 are biased outward of dielectric sheets 20 and 22 (the thicknesses of contactor holder plates 14 and 18 are sufficient to enclose the barrel bodies of spring probes 24 and 30 while enabling spring pins thereof to project out from dielectric sheets 20 and 22); and (b) each of the through holes in contactor holder plates 14 and 18 have substantially the same diameter. Spring probes suitable for use in fabricating one or more such embodiments of the present invention are available in many shapes and body diameters from suppliers such as, for example and without limitation, Everett Charles Technologies of Pomona Calif. ("Everett Charles"), Rika Denshi America of Attleboro Mass. ("Rika Denshi"), and Interconnect Devices, Inc. ("IDI") of Kansas City Kans.

In accordance with one or more such embodiments of the present invention, contactor holder plates 14 and/or 18 are thermally conductive sheets having through holes that accommodate spring probes 24 and 30. In accordance with one or more such embodiments of the present invention, contactor holder plates 14 and/or 18 are made of a thermally conductive material such as, for example and without limitation, copper, copper alloys (for example and without limitation, copper alloy 145 that is available from Olin Corporation of Norwalk, Conn.), bronze, copper plated, nickel-iron alloys (for example and without limitation, copper plated invar), silver alloys, aluminum, aluminum alloys, berylia, aluminum nitride, silicon, and silicon carbide. In accordance with one or more such embodiments, the material used to fabricate contactor holder plate 14 and/or 18 is selected to have a relatively high thermal conductivity, for example and without limitation, 0.1 Watts/° C.-cm² or greater and preferably greater than 0.3 Watts/° C.-cm². Further, in accordance with one or more further such embodiments, contactor holder plates 14 and 18 have substantially parallel, planar major surfaces. Still further, in accordance with one or more still further such embodiments, contactor holder plates 14 and 18 are secured together, for example and without limitation, by bolts (not shown) which extend through holes formed in contactor holder late 14, and are screwed into threaded holes formed in contactor holder plate 18.

As further shown in FIG. 1A, and in accordance with one or more embodiments of the present invention, contactor holder plates 14 and 18 may be separated by dielectric layer 16—for example and without limitation, dielectric layer 16 may be present in regions which surround spring probes 24 (as will be described below, spring probes 24 carry signals). In accordance with one or more such embodiments of the present invention, dielectric layer 16 may be used to space contactor holder plates 14 and 18 to adjust a characteristic impedance of spring probes 24 to a predetermined value, for example and without limitation, fifty (50) ohms where the characteristic impedance of spring probes 24 may be determined by, among other things, the thickness and material properties of contactor holder plates 14 and 18, the diameter of the through holes, the barrel body diameter of spring probes 24, the dielectric constant(s) of dielectric material(s) in the through hole, and the thickness and dielectric constant of dielectric sheet 16, if present, (where dielectric sheet 16 may comprise one or more dielectric sheets of the same or differing dielectric constants)—as may be calculated using any one of a number of three dimensional field solver algorithms (for example, the IBM Electromagnetic Field Solver Suite of Tools) that are well known to those of ordinary skill in the art.

As further shown in FIG. 1A, and in accordance with one or more embodiments of the present invention, contactor holder plates 14 and 18 are thermally connected to heat sink 38 by clamp 36. In accordance with one or more such embodiments, heat sink 38 and clamp 36 are made of a thermally conductive material such as, for example and without limitation, copper, aluminum alloy 6061, or copper alloy 145, all of which are commonly available. In addition, and in accordance with one or more embodiments of the present invention, spring probes 24 and 30 may be arranged in a pattern of impedance-controlled signal contactors and low impedance power and ground contactors that matches that of terminals and contacts to which socket 10 may be connected.

As shown in FIG. 1A, and in accordance with one or more embodiments of the present invention, the through holes in contactor holder plates 14 and 18 have substantially the same diameter, and spring probes 24 and 30 have different barrel body diameters. This provides a different spacing between the through holes and: (i) the barrel bodies of spring probes 24, and (ii) the barrel bodies of spring probes 30, respectively. As a result, and in accordance with the present invention, this provides a difference in impedance of, and thermal resistance to, contactor holder plates 14 and 18 for spring probes 24 and 30.

As further shown in FIG. 1A, each of spring probes 24 and 30 is separated from contactor holder plates 14 and 18 by an air gap. In accordance with one or more further such embodiments of the present invention, to further avoid contact between spring probes 24 and 30 and contactor holder plates 14 and 18, an inside surface of each through hole in contactor holder plates 14 and 18 may be coated with a thin dielectric layer such as, for example and without limitation, Parylene (available from Specialty Coating Systems of Indianapolis Ind.). In accordance with one or more such embodiments, a dielectric layer may extend over all or portions of other surfaces of the contactor holder plate(s).

In accordance with one or more embodiments of the present invention, spring probes 30 may be used to contact power or ground terminals of a device (as is well known, the term terminal refers to an electrical contact on a device). Power and ground currents are limited typically to about 2 to 8 amperes by the current carrying capability of spring probes. For example, a typical Pogo® spring contact can handle a maximum amount of power before it overheats, and its springs lose temper. Since power is determined by $I^2R$ (where I is current and R is resistance), this limitation can be translated into a limitation on current carried by such a contactor. Thus, such contactors cannot be readily utilized in high power applications unless this limitation is overcome.

In accordance with one or more embodiments of the present invention, benefits may be achieved for socket 10 by having a spacing between the barrel body of each of power and ground spring probes 30 and a surface of their through holes in contactor holder plates 14 and 18 that is small. Preferably, a small spacing of about 0.1 mm provides a relatively low thermal resistance between spring probes 30 and thermally conductive contactor holder plates 14 and/or 18 (when compared with a thermal resistance between signal spring probes 24 and contactor holder plates 14 and 18). Advantageously, this results in an enhanced thermal conductivity from power and ground spring probes to contactor holder plates 14 and 18. Thus, in accordance with the enhanced thermal conductivity provided by socket 10, the amount of current carried by spring probes 30 can be increased. As one skilled in the art will readily appreciate, using a small spacing between a body of a signal spring probe and a through hole in a conductive body is not practical because a larger spacing is typically necessary due to a requirement that the ratio of probe body diameter to through hole diameter is determined by signal impedance. By way of example, an impedance of 50 ohms requires that this ratio be about 2.3.

As one can readily appreciate from FIG. 1A, heat is conducted: (a) through the spacing between each contactor and its corresponding through hole in contactor holder plates 14 and 18 and away from the contactor; (b) through contactor holder plates 14 and/or 18; (c) through clamp 36; and (d) into heat sink 38 (for example and without limitation, a thermal mass through which socket 10 is cooled). In accordance with one or more embodiments of the present invention, thermal conductivity from spring probes 30 (used to contact power or ground terminals) to contactor holder plates 14 and 18 is high due to a small spacing between a barrel body of spring probes 30 and a corresponding through hole in contactor holder plates 14 and 18. Further, in accordance with one or more such embodiments of the present invention, heat may be carried away from heat sink 38 by a thermal transfer fluid flowing through channel 40 in heat sink 38. Those of ordinary skill in the art will readily appreciate that channel 40 may also include a multiplicity of channels designed in accordance with any one of a number of methods well known to one of ordinary skill in the art to enable efficient transfer of heat therefrom to the thermal transfer fluid. In accordance with one or more such embodiments, such channels may be microchannels, for example and without limitation, for use preferably when the thermal transfer fluid is a gas. For example and without limitation, in accordance with one or more such embodiments, heat sink 38 comprises a block of thermally conductive material with microchannels for thermal transfer fluid flow within the block. In addition, in accordance with one or more further embodiments of the present invention, heat sink 38 a set of channels that are interdigitated so that walls between the channels are relatively thin to maximize thermal conductivity, reduce thermal gradients, and promote uniform temperatures across a surface of a plate that overlays the interdigitated channels. In accordance with one or more further embodiments of the present invention, the set of channels includes a single serpentine channel that switches back and forth. In accordance with one or more such embodiments of the present invention, the thermal transfer fluid may be selected from a group including, but not limited to, water, water-glycol mixtures, Fluorinert (available from 3M Corporation, St. Paul, Minn.), Galden® (available from Solvay Chemicals, Inc., Houston, Tex.), compressed air, air, nitrogen and helium. Thus, in accordance with one or more embodiments of the present invention, spring probes 30 of socket 10 are prevented from overheating due to high currents passing therethrough.

In accordance with one or more embodiments of the present invention, contactor holder plates 14 and/or 18 may be electrically conductive metallic plates. Further, spring probes 24 may be used to contact signal terminals on a device. Typically, signal connections through a socket are designed to have an electrical impedance between 20 and 100 ohms, and preferably 50 ohms. To estimate signal contactor electrical impedance, one may use a ratio of a diameter of a through hole in contactor holder plates 14 and 18 to an average diameter of a barrel body of spring probes 24 disposed in the through hole—taken together with a design of spring probe 24 (for example, a shape of the barrel body of spring probe 24, and electrical properties of spring probe 24), spacing to nearest neighbor contactors, and effects of various dielectric layers such as dielectric layer 16. In applications where air fills the space in the through holes and the thickness of dielectric layer 16 is negligible with respect to the thickness of metallic contactor holder plates 14 and 18, the impedance of a contactor used for signal terminals is given approximately by $Z_S = 60 \ln(D_{signal\ hole}/D_{signal\ body})$. As such, in accordance with one or more embodiments of the present invention, for applications where air fills the space, the diameter of a cylindrical, coaxial through hole ($D_{signal\ hole}$) in contactor holder plates 14 and 18 (when configured as a ground shield) is about 2.3 times the diameter of the barrel body ($D_{signal\ body}$) of spring probe 24 to achieve a signal impedance of 50 ohms.

Further advantages accrue for embodiments wherein contactor holder plates 14 and/or 18 are metallic due to a reduction of impedance of the power and ground spring probes. As is well known to those of ordinary skill in the art, a low impedance contactor is advantageous for making power and ground connections to a high performance device to reduce noise at the power and ground in the device caused by fluctuations in power and ground currents.

To estimate power or ground contactor impedance, one may use a ratio of a diameter of a through hole in contactor holder plates 14 and 18 to an average diameter of a barrel body of spring probes 30 disposed in the through hole—taken together with a design of spring probe 30 (for example, a shape of the barrel body of spring probe 30, and electrical properties of spring probe 30), spacing to nearest neighbor contactors, and effects of various dielectric layers such as dielectric layer 16. In applications where air fills the space in the through holes and contactor holder plates 14 and 18 are metallic, the impedance of a contactor used for power or ground terminals is given approximately by $Z_P = 60 \ln(D_{power\ hole}/D_{power\ body})$. In this approximation, $D_{power\ hole}$ is the diameter of the power or ground through hole in contactor holder plates 14 and 18, and $D_{power\ body}$ is the average diameter of the body of the power or ground contactor. As such, and in accordance with one or more embodiments of the present invention, the impedance of power and ground contactors is preferably no more than 80 percent of the impedance of signal contactors to provide a significant reduction in power and ground characteristic impedance. In accordance with mathematical formulations for impedance, a requirement that the power contactor characteristic impedance be 80 percent or less than the signal contactor characteristic impedance is approximately satisfied by a mathematical expression: $(D_{signal\ hole}/D_{signal\ body}) \approx 1.18*(D_{power\ hole}/D_{power\ body})$. Equivalently, the requirement that the power contactor impedance be no greater than 80 percent of the signal contactor impedance is approximately satisfied by a second mathematical expression: $(A_{signal\ hole}/A_{signal\ body}) \approx 1.4*(A_{power\ hole}/A_{power\ body})$. In this second mathematical expression, $(A_{signal\ hole}/A_{signal\ body})$ is a ratio of the cross sectional area of the through hole for the signal contactor to the cross sectional area of the body of the signal contactor. Correspondingly, $(A_{power\ hole}/A_{power\ body})$ is a ratio of the cross sectional area of the through hole for the power or ground contactor to the cross sectional area of the body of the power or ground contactor. Further, for embodiments in which any of the through holes in the contactor holder plates or any of the contactor bodies is not a right circular cylinder, the second mathematical expression is an approximate estimation of the requirement necessary to provide that a power and ground contactor has a characteristic impedance that is 80 percent or less than the characteristic impedance of a signal contactor.

As one can readily appreciate from the above, one or more embodiments of socket 10 that incorporate electrically conductive (for example, metallic) contactor holder plates may provide: (a) well shielded, controlled impedance, contactors for signal terminals (for example an impedance of about 50 ohms); (b) low impedance power or ground contactors; and (c) a thermal conduction path from power or ground contactors to a heat sink. In addition, the controlled impedance, together with electrical shielding of adjacent spring probes by electrically conductive contactor holder plates 14 and 18, provides a high integrity signal path for high performance devices.

Figure 1B:
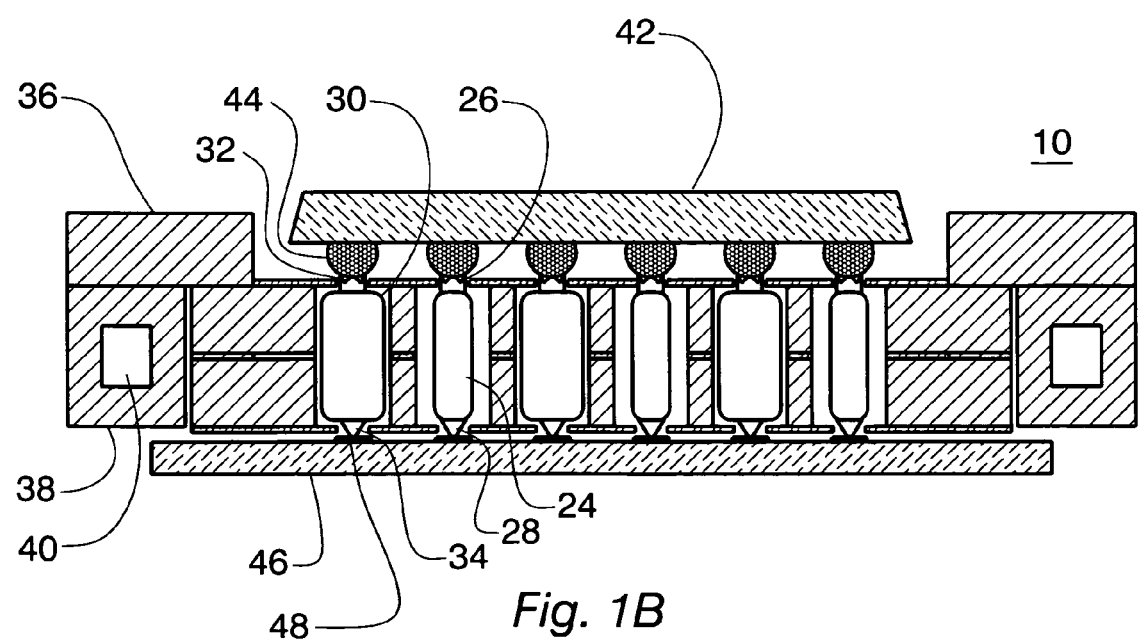
FIG. 1B shows a cross sectional view of the socket shown in FIG. 1A in use for testing by providing a connection between a device under test ("DUT") and a device under test board ("DUT board")

FIG. 1B shows a cross sectional view wherein socket 10 is used to test device under test 42 ("DUT 42"). As shown in FIG. 1B, ball grid array 44 of DUT 42 is engaged with socket 10 by contact between ball grid array 44 and top spring pins 26 and 32 of spring probes 24 and 30, respectively. As further shown in FIG. 1B, device under test board 46 ("DUT board 46") is engaged with socket 10 by contact between contact pads 48 of DUT board 46 (as is well known, the term contact pad refers to an electrical contact on DUT board 46) and bottom spring pins 28 and 34 of spring probes 24 and 30, respectively. To effectuate this arrangement, spring pins 28 and 34 are compressed into the bodies of spring probes 24 and 30, respectively, as socket 10 is urged into contact with DUT board 46. Then, DUT 42 is urged into contact with spring probes 24 and 30 of socket 10; thereby compressing crown-shape-headed spring pins 26 and 32 into the bodies of spring probes 24 and 30, respectively. As a result, electrical contact is made between solder balls of ball grid array 44 of DUT 42 and spring pins 28 and 32, thereby making an electrical contact between solder balls of ball grid array 44 and contact pads 48 on DUT board 46. Hence, electrical signals, and power and ground currents are conducted from circuits in DUT board 46 to corresponding solder balls of ball grid array 44 on DUT 42. Contactor holder plates 14 and 18 may be grounded to the socket case, or to either of the power or the ground spring probes.

In accordance with one or more embodiments of the present invention, each of spring probes 24 and 30 of socket 10 is mounted in a through hole having a diameter of about 1.15 mm in contactor holder plates 14 and 18. In accordance with one or more such embodiments, each of spring probes 24 (used to contact signal terminals of DUT 42) is a Single-Ended, Mini-Mite™, Pogo probe SCP-080ZB-001 (available from Everett Charles) that has a barrel body diameter of about 0.52 mm and a length of about 3.89 mm. Further, in accordance with one or more such embodiments, each of spring probes 30 (used to contact power and ground terminals of DUT 42) is a Single-Ended, Mini-Mite™, Pogo probe SCP-127ZB-001 (obtainable from Everett Charles) that has a barrel body diameter of about 0.95 mm and a length of about 3.89 mm. Still further, in accordance with one or more such embodiments, a grid spacing between spring probes 24 and 30 is about 1.27 mm, and dielectric sheets 20 and 22 are thin sheets of dielectric material, for example and without limitation, each may be a film of polyimide flex materials having a thickness of about 0.05 mm. Still further, in accordance with one or more such embodiments, dielectric layer 16 is a polyimide sheet having a thickness of about 0.1 mm.

Although the above-described embodiments used contactors of the Pogo® spring contact type, it should be understood by one of ordinary skill in the art that this does not limit all embodiments of the present invention to their use. In fact, further embodiments of the present invention may be fabricated wherein other contactors are used such as, for example and without limitation, barrel springs available from Mill-Max Manufacturing Corp. of Oyster Bay, N.Y., contact springs, formed springs, and tubular connectors. It should be further understood by one of ordinary skill in the art that spring probes of many shapes and specifications may be used in place of the above-described Everett Charles spring probes. Lastly, it should be understood by one of ordinary skill in the art that the spring probes shown in FIGS. 1A and 1B are representations that are provided for purposes of simplifying the explanation of the various embodiments, and that they are not an exact representation of any particular spring probe.

Figure 2A:
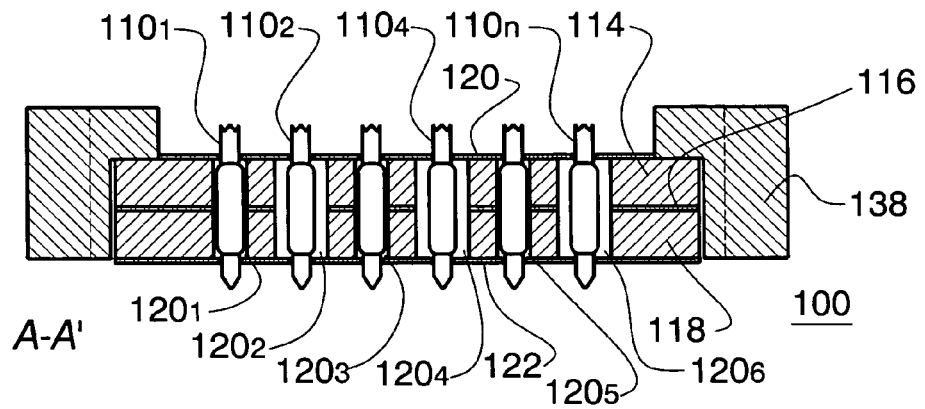
FIGS. 2A and 2B show a cross sectional view and a top view, respectively, of a socket that is fabricated in accordance with one or more further embodiments of the present invention.
Figure 2B:
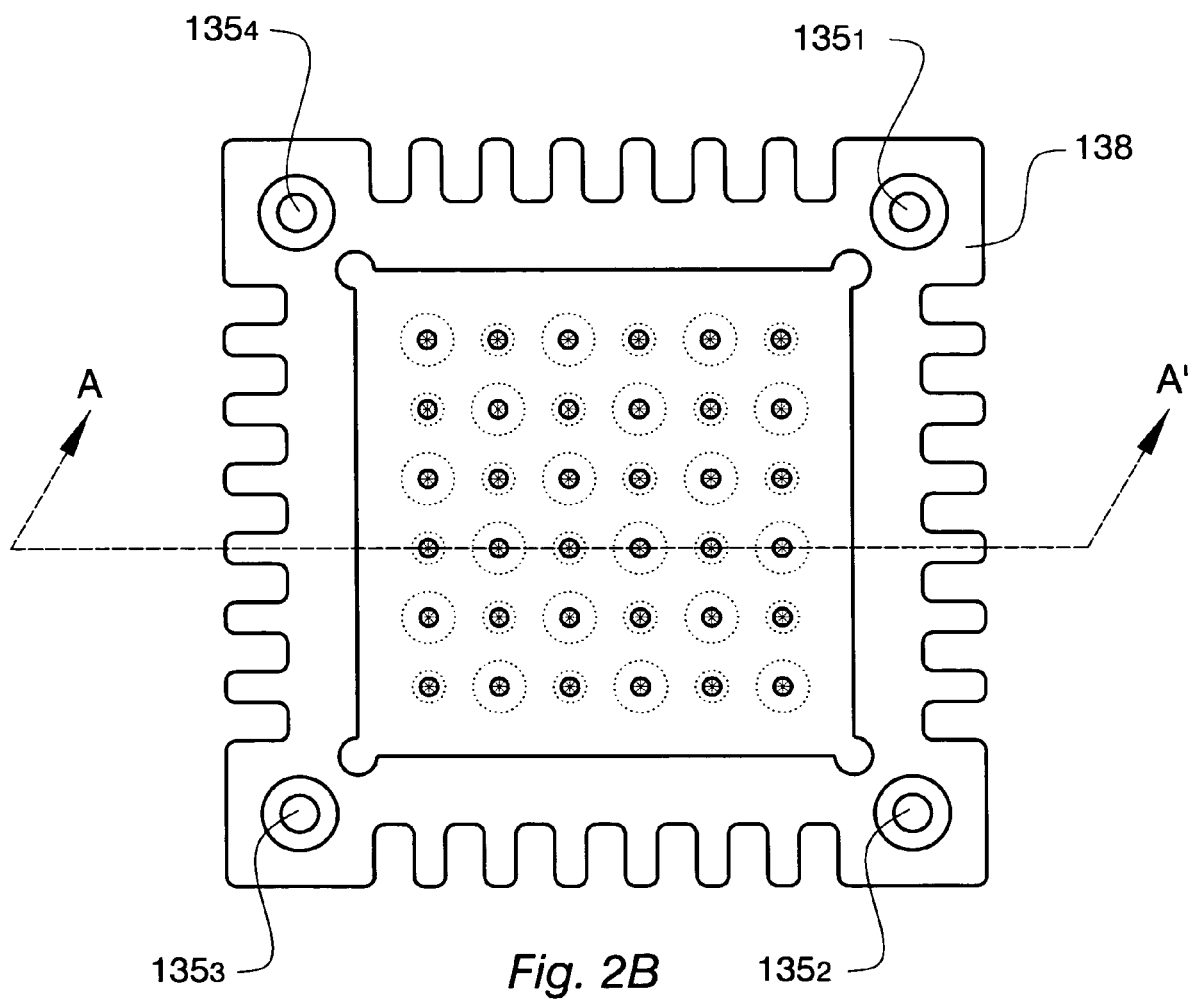

FIGS. 2A and 2B show a cross sectional view and a top view, respectively, of socket 100 that is fabricated in accordance with one or more further embodiments of the present invention—FIG. 2A is a cross sectional view of socket 100 in a direction indicated by arrows AA' in FIG. 2B. In accordance with one or more embodiments of the present invention, socket 100 can be used, among other things, as a socket for contacting an integrated circuit or other microelectronic or electronic device.

As shown in FIG. 2A, socket 100 comprises contactors $110_1$-$110_n$ in the form of spring probes that are held in circular, cylindrical through holes in contactor holder plates 114 and 118 by dielectric sheets 120 and 122. As shown in FIG. 2A, dielectric sheets 120 and 122: (a) have holes for spring pins of the spring probes; (b) prevent contactors $110_1$-$110_n$ from making contact with contactor holder plates 114 and 118; and (c) provide insulation between socket 100 and any device or test board to which socket 100 may be contacted. As further shown in FIG. 2A, spring pins of contactors $110_1$-$110_n$ are biased outward of dielectric sheets 120 and 122 (the thicknesses of contactor holder plates 114 and 118 are sufficient to enclose the barrel bodies of contactors $110_1$-$110_n$, while enabling spring pins thereof to project out from dielectric sheets 120 and 122). Spring probes suitable for use in fabricating one or more such embodiments of the present invention are available in many shapes and body diameters from suppliers such as, for example and without limitation, Everett Charles, Rika Denshi, and IDI.

In accordance with one or more such embodiments of the present invention, contactor holder plates 114 and/or 118 are thermally conductive sheets having through holes that accommodate contactors $110_1$-$110_n$. In accordance with one or more such embodiments of the present invention, contactor holder plates 114 and 118 are made of a thermally conductive material such as, for example and without limitation, copper, copper alloys (for example and without limitation, copper alloy 145 that is available from Olin Corporation of Norwalk, Conn.), bronze, copper plated, nickel-iron alloys (for example and without limitation, copper plated invar), silver alloys, aluminum, aluminum alloys, berylia, aluminum nitride, silicon, and silicon carbide. In accordance with one or more such embodiments, the material used to fabricate contactor holder plate 114 and/or 118 is selected to have a relatively high thermal conductivity, for example and without limitation, 0.1 Watts/° C.-cm$^2$ or greater and preferably greater than 0.3 Watts/° C.-cm$^2$. Further, in accordance with one or more further such embodiments, contactor holder plates 114 and 118 have substantially parallel, planar major surfaces. Still further, in accordance with one or more still further such embodiments, contactor holder plates 114 and 118 are secured together, for example and without limitation, by bolts (not shown) which extend through holes formed in contactor holder plate 114 and are screwed into threaded holes formed in contactor holder plate 118.

As further shown in FIG. 2A, and in accordance with one or more embodiments of the present invention, contactor holder plates 114 and 118 may be separated by dielectric layer 116—for example and without limitation, dielectric layer 116 may be present in regions which surround those of the contactors that carry signals (for example, contactors $110_2$, $110_4$ and $110_n$ shown in FIG. 2A). In accordance with one or more such embodiments of the present invention, dielectric layer 116 may be used to space contactor holder plates 114 and 118 to adjust a characteristic impedance of certain contactors to a predetermined value, for example and without limitation, fifty (50) ohms where the characteristic impedance of the certain contactors may be determined by, among other things, the thickness and material properties of contactor holder plates 114 and 118, the diameter of through holes for the certain contactors, the barrel body diameter of the certain contactors, the dielectric constant(s) of dielectric material(s) in the through hole, and the thickness and dielectric constant of dielectric sheet 116, if present, (where dielectric sheet 116 may comprise one or more dielectric sheets of the same or differing dielectric constants)—as may be calculated using any one of a number of three dimensional field solver algorithms (for example, the IBM Electromagnetic Field Solver Suite of Tools) that are well known to those of ordinary skill in the art.

As further shown in FIG. 2A, and in accordance with one or more embodiments of the present invention, contactor holder plates 114 and 118 are thermally connected to air-cooled, finned heat sink 138. In accordance with one or more such embodiments, heat sink 138 is made of a thermally conductive material such as, for example and without limitation, copper, aluminum alloy 6061, or copper alloy 145, all of which are commonly available. In addition, in accordance with one or more such embodiments, heat sink 138 may be integral with one or both of contactor holder plates 114 and 118.

In addition, and in accordance with one or more embodiments of the present invention, contactors $110_1$-$110_n$ may be arranged in a pattern of impedance-controlled signal contactors and low impedance power and ground contactors that matches that of terminals and contacts to which socket 100 may be connected. In further addition, as shown in FIG. 2B, and in accordance with one or more embodiments of the present invention, socket 100 may be connected to a DUT board by means of, for example and without limitation, cap head screws (not shown), located in four counter-bored holes $135_1$-$135_4$ in the corners of socket 100.

As shown in FIG. 2A, and in accordance with one or more embodiments of the present invention, contactor holder plates 114 and 118 have through holes $120_1$, $120_3$, and $120_5$ of diameter $D_1$ and through holes $120_2$, $120_4$, and $120_6$ of diameter $D_2$; wherein $D_1$ and $D_2$ are different and $D_2 > D_1$. In addition, as further shown in FIG. 2A, each of contactors $110_1$-$110_n$ has a body with substantially the same diameter. As such, there is a different spacing between the barrel bodies of certain ones of contactors $110_1$-$110_n$ and their corresponding through holes. As a result, and in accordance with the present invention, this provides a difference in impedance of, and thermal resistance to, contactor holder plates 114 and 118 for certain ones of contactors $110_1$-$110_n$.

As further shown in FIG. 2A, each of contactors $110_1$-$110_n$ is separated from contactor holder plates 114 and 118 by an air gap. In accordance with one or more further such embodiments of the present invention, to further avoid contact between contactors $110_1$-$110_n$ and contactor holder plates 114 and 118, an inside surface of each through hole in contactor holder plates 114 and 118 may be coated with a thin dielectric layer such as, for example and without limitation, Parylene. In accordance with one or more such embodiments, a dielectric layer may extend over all or portions of other surfaces of the contactor holder plate(s).

In accordance with one or more embodiments of the present invention, contactors $110_1$, $110_3$, and $110_5$ (having a relatively small space between a side of corresponding through holes and a barrel body of these contactors) may be used to contact power or ground terminals of a device, and contactors $110_2$, $110_4$, and $110_n$ (having a relatively larger space between a side of corresponding through holes and a barrel body of these contactors) may be used to contact signal terminals of the device.

In accordance with one or more embodiments of the present invention, benefits may be achieved for socket 100 by having a spacing between the barrel body of each contactor used to contact power or ground terminals of a device and a surface of their through holes in contactor holder plates 114 and 118 that is small. Preferably, a small spacing of about 0.1 mm provides a relatively low thermal resistance between contactors used to contact power or ground terminals and thermally conductive contactor holder plates 114 and/or 118 (when compared with a thermal resistance between contactors used to contact signal terminals and contactor holder plates 114 and 118). Advantageously, this results in an enhanced thermal conductivity from power and ground contactors to contactor holder plates 114 and 118. Thus, in accordance with the enhanced thermal conductivity provided by socket 100, the amount of current carried by power and ground contactors can be increased.

As one can readily appreciate from FIG. 2A, heat is conducted: (a) through the spacing between each contactor and its corresponding through hole in contactor holder plates 114 and 118 and away from the contactor; (b) through contactor holder plates 114 and/or 118; and (c) into air-cooled, finned heat sink 138 (refer to FIG. 2B). Also, in accordance with one or more such embodiments, thermal conductivity from a contactor (used to contact power or ground terminals) to contactor holder plates 114 and 118 is high due to a small spacing between a barrel body of the contactor probe and a corresponding through hole in contactor holder plates 114 and 118. As one of ordinary skill in the art can readily appreciate, socket 10 described above in conjunction with FIG. 1A, may also use an air-cooled, finned heat sink like heat sink 138 instead of heat sink 38. In addition, as one of ordinary skill in the art can readily appreciate, socket 10 described above in conjunction with FIG. 1A and socket 100 described above in conjunction with FIGS. 2A and 2B may also a fluid cooled cold plate, a convection cooled cold plate, and other heat sinks known in the art instead of heat sink 38 and heat sink 138, respectively.

In accordance with one or more embodiments of the present invention, contactor holder plates 114 and/or 118 may be electrically conductive metallic plates. Further, certain of the contactors may be used to contact signal terminals on a device. Typically, signal connections through a socket are designed to have an electrical impedance between 20 and 100 ohms, and preferably 50 ohms. To estimate signal contactor electrical impedance, one may use a ratio of a diameter of a through hole in contactor holder plates 114 and 118 to an average diameter of a barrel body of such contactors used to contact signal terminals disposed in the through hole—taken together with a design of such contactors (for example, a shape of the barrel body of such contactors, and electrical properties of such contactors), spacing to nearest neighbor contactors, and effects of various dielectric layers such as dielectric layer 116. In applications where air fills the space in the through holes and the thickness of dielectric layer 116 is negligible with respect to the thickness of metallic contactor holder plates 114 and 118, the impedance of a contactor used for signal terminals is given approximately by $Z_S = 60 \ln(D_{signal\ hole}/D_{signal\ body})$. As such, in accordance with one or more embodiments of the present invention, for applications where air fills the space, the diameter of a cylindrical, coaxial through hole ($D_{signal\ hole}$) in contactor holder plates 114 and 118 (when configured as a ground shield) is about 2.3 times the diameter of the barrel body ($D_{signal\ body}$) of contactors used to contact signal terminals to achieve a signal impedance of 50 ohms.

Further advantages accrue for embodiments wherein contactor holder plates 114 and/or 118 are metallic due to a reduction of impedance of the power and ground spring probes. As is well known to those of ordinary skill in the art, a low impedance contactor is advantageous for making power and ground connections to a high performance device to reduce noise at the power and ground in the device caused by fluctuations in power and ground currents.

To estimate power or ground contactor impedance, one may use a ratio of a diameter of a through hole in contactor holder plates 114 and 118 to an average diameter of a barrel body of contactors used to contact power or ground terminals disposed in the through hole—taken together with a design of such contactors (for example, a shape of the barrel body of such contactors, and electrical properties of such contactors), spacing to nearest neighbor contactors, and effects of various dielectric layers such as dielectric layer 116. In applications where air fills the space in the through holes and contactor holder plates 114 and 118 are metallic, the impedance of a contactor used for power or ground terminals is given approximately by $Z_P = 60 \ln(D_{power\ hole}/D_{power\ body})$. In this approximation, $D_{power\ hole}$ is the diameter of the power or ground through hole in contactor holder plates 114 and 118, and $D_{power\ body}$ is the average diameter of the body of the power or ground contactor. As such, and in accordance with one or more embodiments of the present invention, the impedance of power and ground contactors is preferably no more than 80 percent of the impedance of signal contactors to provide a significant reduction in power and ground characteristic impedance. In accordance with mathematical formulations for impedance, a requirement that the power contactor characteristic impedance be 80 percent or less than the signal contactor characteristic impedance is approximately satisfied by a mathematical expression: $(D_{signal\ hole}/D_{signal\ body}) \approx 1.18 * (D_{power\ hole}/D_{power\ body})$. Equivalently, the requirement that the power contactor impedance be no greater than 80 percent of the signal contactor impedance is approximately satisfied by a second mathematical expression: $(A_{signal\ hole}/A_{signal\ body}) \approx 1.4*(A_{power\ hole}/A_{power\ body})$. In this second mathematical expression, $(A_{signal\ hole}/A_{signal\ body})$ is a ratio of the cross sectional area of the through hole for the signal contactor to the cross sectional area of the body of the signal contactor. Correspondingly, $A_{power\ hole}/A_{power\ body})$ is a ratio of the cross sectional area of the through hole for the power or ground contactor to the cross sectional area of the body of the power or ground contactor. Further, for embodiments in which any of the through holes in the holder plates or any of the contactor bodies is not a right circular cylinder, the second mathematical expression is an approximate estimation of the requirement necessary to provide that a power and ground contactor has a characteristic impedance that is 80 percent or less than the characteristic impedance of a signal contactor.

As one can readily appreciate from the above, one or more embodiments of socket 100 that incorporate electrically conductive (for example, metallic) contactor holder plates may provide: (a) well shielded, controlled impedance, contactors for signal terminals (for example an impedance of about 50 ohms); (b) low impedance power or ground contactors; and (c) a thermal conduction path from power or ground contactors to a heat sink. In addition, the controlled impedance together with electrical shielding of adjacent contactors by conductive contactor holder plates 114 and 118, provides a high integrity signal path for high performance devices.

In accordance with one or more embodiments of the present invention, contactors $110_1$-$110_n$ are spring probes of type B1679-K10 (available from Rika Denshi) that have a barrel body diameter ($D_C$) of about 0.35 mm. Further, in accordance with one or more such embodiments, the contactors used to contact signal terminals are disposed in through holes having a diameter $D_2$ of about 0.78 mm, and the contactors used to contact power or ground terminals are disposed in through holes having a diameter $D_1$ of about 0.40 mm. Still further, in accordance with one or more such embodiments, a grid spacing between contactors is about 1.0 mm, and dielectric sheets 120 and 122 are thin sheets of dielectric material, for example and without limitation, each may be a film of polyimide flex materials having a thickness of about 0.05 mm. Still further, in accordance with one or more such embodiments, dielectric layer 116 is a polyimide sheet having a thickness of about 0.1 mm. Yet still further, in accordance with one or more such embodiments, contactor holder plates 114 and 118 are anodized aluminum plates. Advantageously, in accordance with such embodiments, an anodized aluminum layer in the through holes of contactor holder plates 114 and 118 prevents contactors $110_1$-$110_n$ from making electrical contact with contactor holder plates 114 and 118. In further addition, an electrical impedance of a contactor used to contact power and ground terminals, for the design details set forth above, is about 8 ohms. As one of ordinary skill in the art can readily appreciate, socket 10 described above in conjunction with FIG. 1A, may also use anodized aluminum plates for contactor holder plates 14 and 18. Further, in accordance with one or more embodiments of the present invention, contactor holder plates may be conformally coated with a film of insulating material by means well known to those of ordinary skill in the art such as, for example and without limitation, chemical vapor deposition, immersion coating, electrodeposition coating, and thermal decomposition coating.

Although the above-described embodiments used contactors of the Pogo® spring contact type, it should be understood by one of ordinary skill in the art that this does not limit all embodiments of the present invention to their use. In fact, further embodiments of the present invention may be fabricated wherein other contactors are used such as, for example and without limitation, barrel springs available from Mill-Max Manufacturing Corp. of Oyster Bay, N.Y., contact springs, formed springs, and tubular connectors. It should be further understood by one of ordinary skill in the art that spring probes of many shapes and specifications may be used in place of the above-described Everett Charles spring probes. Lastly, it should be understood by one of ordinary skill in the art that the spring probes shown in FIG. 2A are representations that are provided for purposes of simplifying the explanation of the embodiment, and that they are not an exact representation of any particular spring probe.

Thus, as was set forth above, for the embodiments shown in FIGS. 1A and 2A, a first ratio of a diameter of a through hole for contactors used to contact signal terminals to a diameter of a barrel body of contactors used to contact signal terminals that are disposed in the through hole ought to be about the same, namely, about 2.3. Similarly, for the embodiments shown in FIGS. 1A and 2A, a second ratio of a diameter of a through hole for contactors used to contact power or ground terminals to a diameter of a barrel body of contactors used to contact power or ground terminals that are disposed in the through hole ought to be about the same, and the second ratio should preferably be less than the first ratio. In accordance with one or more such embodiments, the second ratio (i.e., for power and ground contactors) is no greater than 0.8 times the first ratio (for signal contactors).

However, as one of ordinary skill in the art can readily appreciate, further embodiments of the present invention exist wherein through holes are varied in size, and wherein the size of the bodies of contactors are varied in size. Further, the ratios of a diameter of a through hole for contactors to a diameter of a contactor body that is disposed in the through hole may be about the same as those set forth above for the various functions to be served by the specific contactor.

As one of ordinary skill in the art can readily appreciate, in accordance with one or more further embodiments of the present invention, thin dielectric sleeves may be inserted in through holes in the contactor holder plates (for example and without limitation, by insertion into opposite ends of a through hole) to abut against the sides of the through hole—the thickness of the dielectric sleeve ought to be such that it does not significantly change a desired contactor impedance (for example, in accordance with one or more embodiments, the dielectric sleeve does not contact a contactor body), or if it does not, other parameters discussed herein may have to be adjusted in the manner discussed herein to achieve the desired contactor impedance. In addition, in accordance with one or more such embodiments, dielectric sleeves may be inserted into opposite ends of each through hole, to abut against a conductive ring of a Pogo® spring contact that has been inserted into the through hole, and thereby, hold the Pogo® spring contact in place vertically. Further, and in accordance with one or more such embodiments, a contact lubricant (for example and without limitation, a thermally conductive lubricant) or other dielectric fluid may be applied to the space between tube connectors and corresponding holes in the contactor holder plates.

Figure 3A:
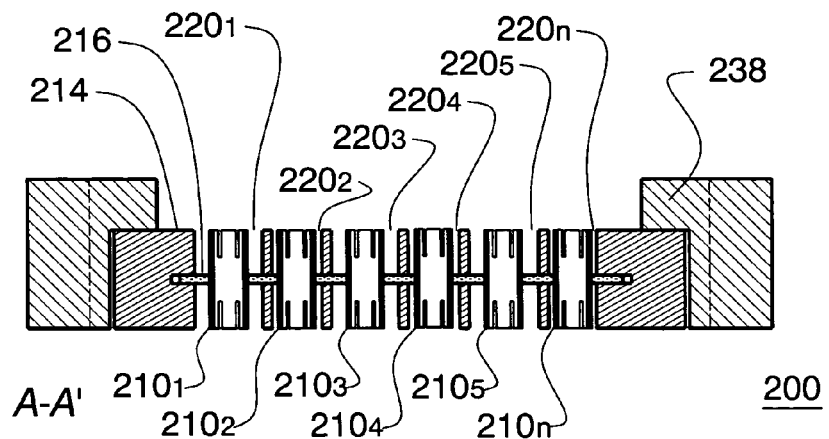
FIGS. 3A and 3B show a cross sectional view and a top view, respectively, of a socket that is fabricated in accordance with one or more still further embodiments of the present invention.
Figure 3B:
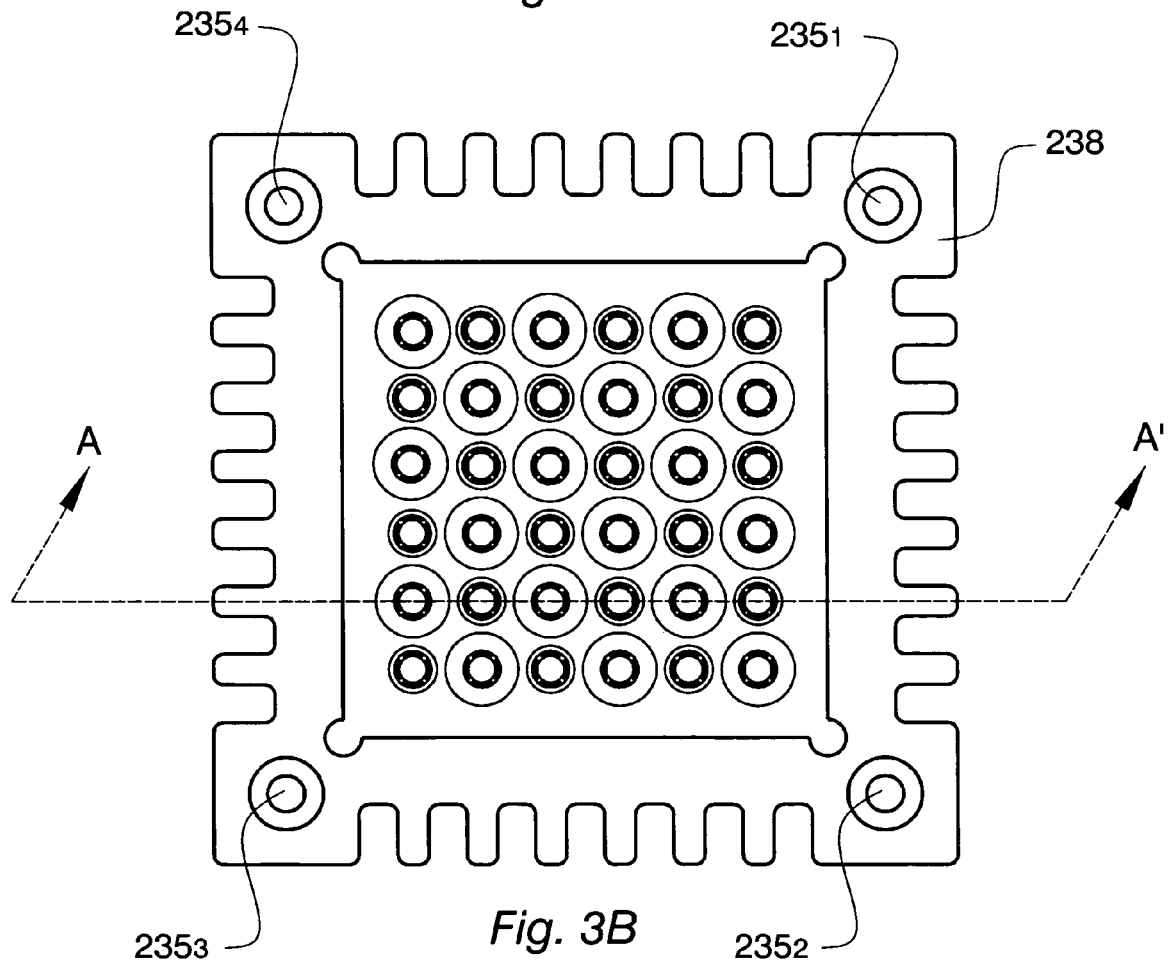

FIGS. 3A and 3B show a cross sectional view and a top view, respectively, of socket 200 that is fabricated in accordance with one or more still further embodiments of the present invention—FIG. 3A is a cross sectional view of socket 200 in a direction indicated by arrows AA' in FIG. 3B. In accordance with one or more embodiments of the present invention, socket 200 can be used, among other things, as a socket for contacting an integrated circuit or other microelectronic or electronic device.

As shown in FIG. 3A, socket 200 comprises contactors in the form of tubular connectors $210_1$-$210_n$ that are held in circular, cylindrical through holes in contactor holder plate 214 by dielectric sheet 216. In accordance with one or more such embodiments of the present invention, dielectric layer 216 may be used to adjust a characteristic impedance of certain contactors to a predetermined value, for example and without limitation, fifty (50) ohms where the characteristic impedance of the certain contactors may be determined by, among other things, the thickness and material properties of contactor holder plate 214, the diameter of through holes for the certain contactors, the tube body diameter of the certain contactors, the dielectric constant(s) of dielectric material(s) in the through hole, and the thickness and dielectric constant of dielectric sheet 216 (where dielectric sheet 216 may comprise one or more dielectric sheets of the same or differing dielectric constants)—as may be calculated using any one of a number of three dimensional field solver algorithms (for example, the IBM Electromagnetic Field Solver Suite of Tools) that are well known to those of ordinary skill in the art. In addition, dielectric sheet 216 prevents tubular connectors $210_1$-$210_n$ from making contact with contactor holder plate 214.

In accordance with one or more such embodiments of the present invention, contactor holder plate 214 is a thermally conductive plate having through holes that accommodate tubular connectors $210_1$-$210_n$. In accordance with one or more such embodiments of the present invention, contactor holder plate 214 is made of a thermally conductive material such as, for example and without limitation, copper, copper alloys (for example and without limitation, copper alloy 145 that is available from Olin Corporation of Norwalk, Conn.), bronze, copper plated, nickel-iron alloys (for example and without limitation, copper plated invar), silver alloys, aluminum, aluminum alloys, berylia, aluminum nitride, silicon, and silicon carbide. In accordance with one or more such embodiments, the material used to fabricate contactor holder plate 214 is selected to have a relatively high thermal conductivity, for example and without limitation, 0.1 Watts/° C.-cm² or greater and preferably greater than 0.3 Watts/° C.-cm². Further, in accordance with one or more further such embodiments, as shown in FIG. 3A, contactor holder plate 214 has substantially parallel, planar major top and bottom surfaces, and top and bottom ends of tubular connector $210_1$-$210_n$ are substantially flush with the top and bottom surfaces of contactor holder plate 214. One of ordinary skill in the art will readily appreciate that further embodiments exist wherein the top and/or bottom ends of tubular connectors $210_1$-$210_n$ may extend beyond the top and bottom surfaces of contactor holder plate 214 while providing that power and/or ground contactors have a higher thermal conductivity to the contactor holder plate(s) than signal contactors have.

Figure 4A:
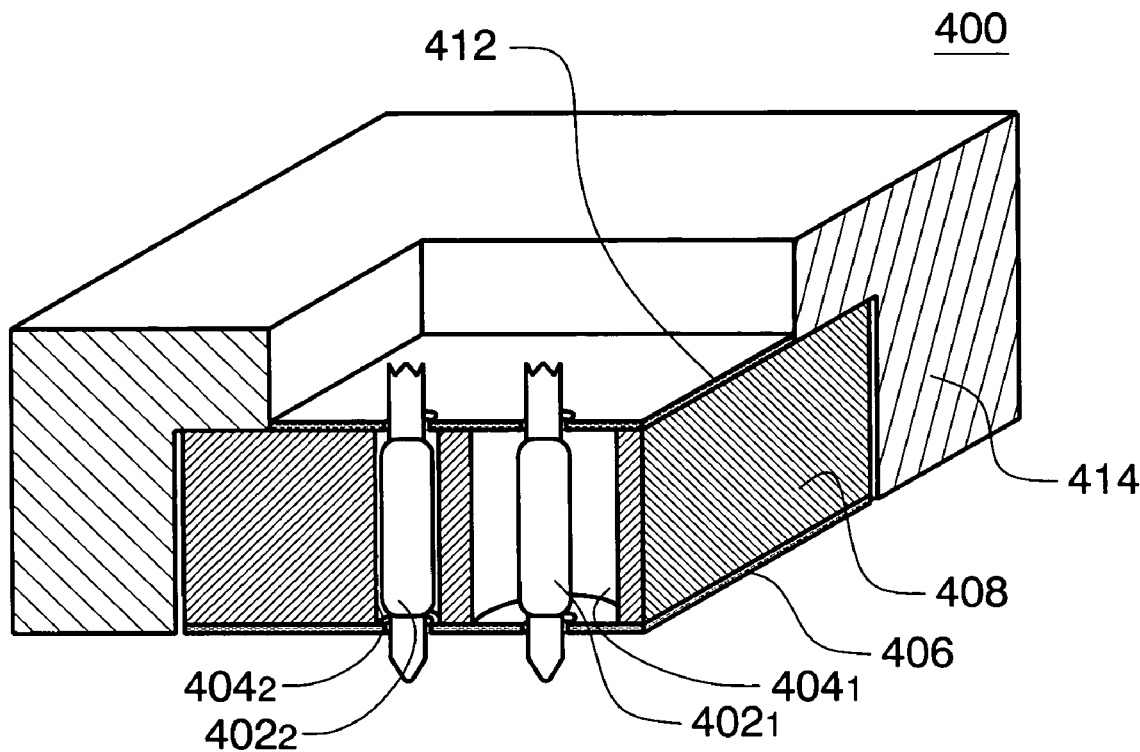
FIG. 4A shows a partial sectional view of a socket that is fabricated in accordance with one or more embodiments of the present invention wherein signal and power/ground contactors comprise spring probes.
Figure 4B:
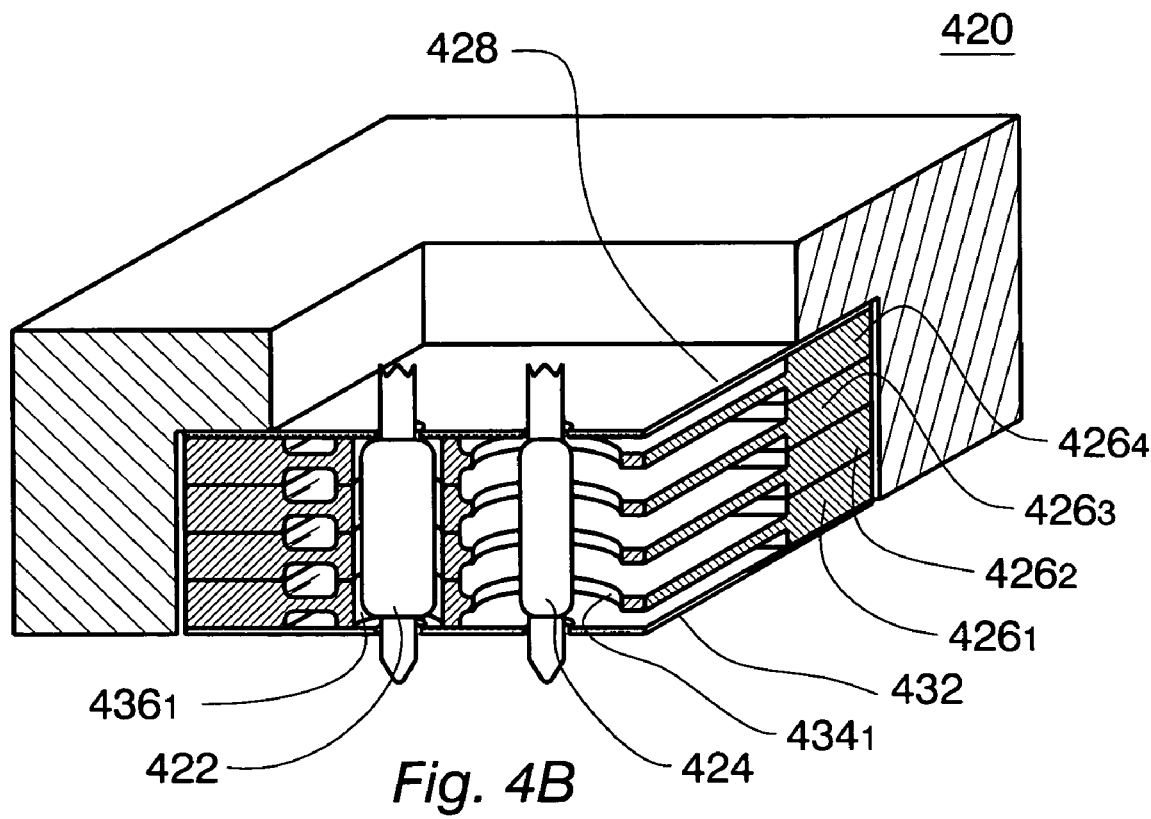
FIG. 4B shows a partial sectional view of a socket that is fabricated in accordance with one or more embodiments of the present invention wherein signal and power/ground contactors comprise spring probes inserted into holes through a stack of several contactor holder plates.
Figure 4C:
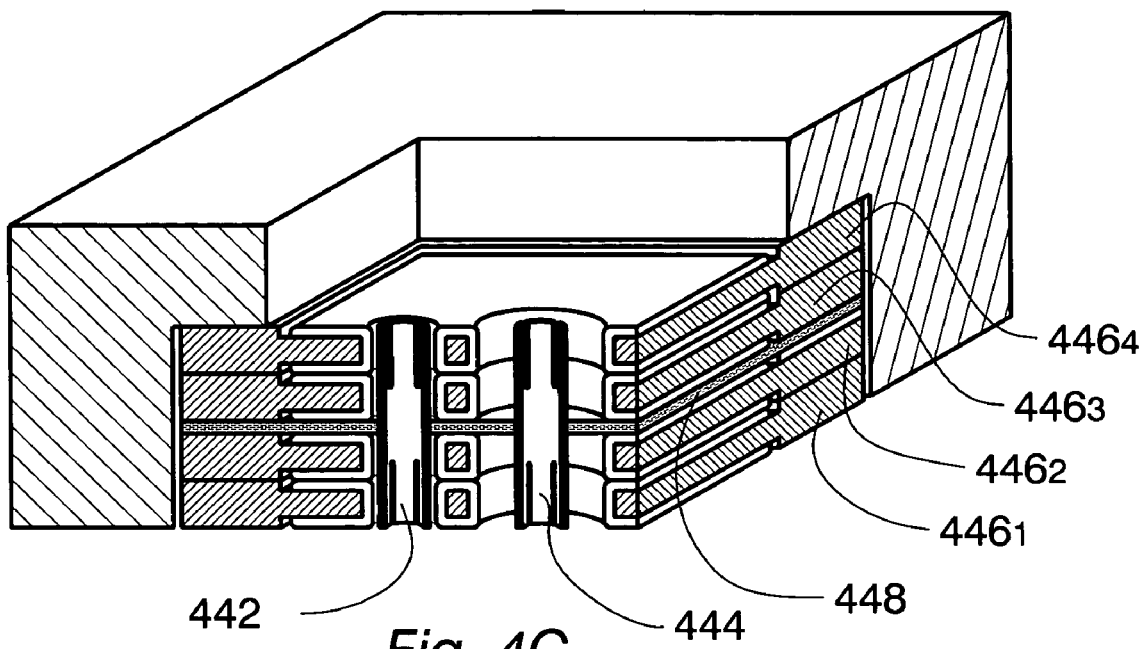
FIG. 4C shows a partial sectional view of a socket that is fabricated in accordance with one or more embodiments of the present invention wherein signal and power/ground contactors comprise tubular connectors.
Figure 4D:
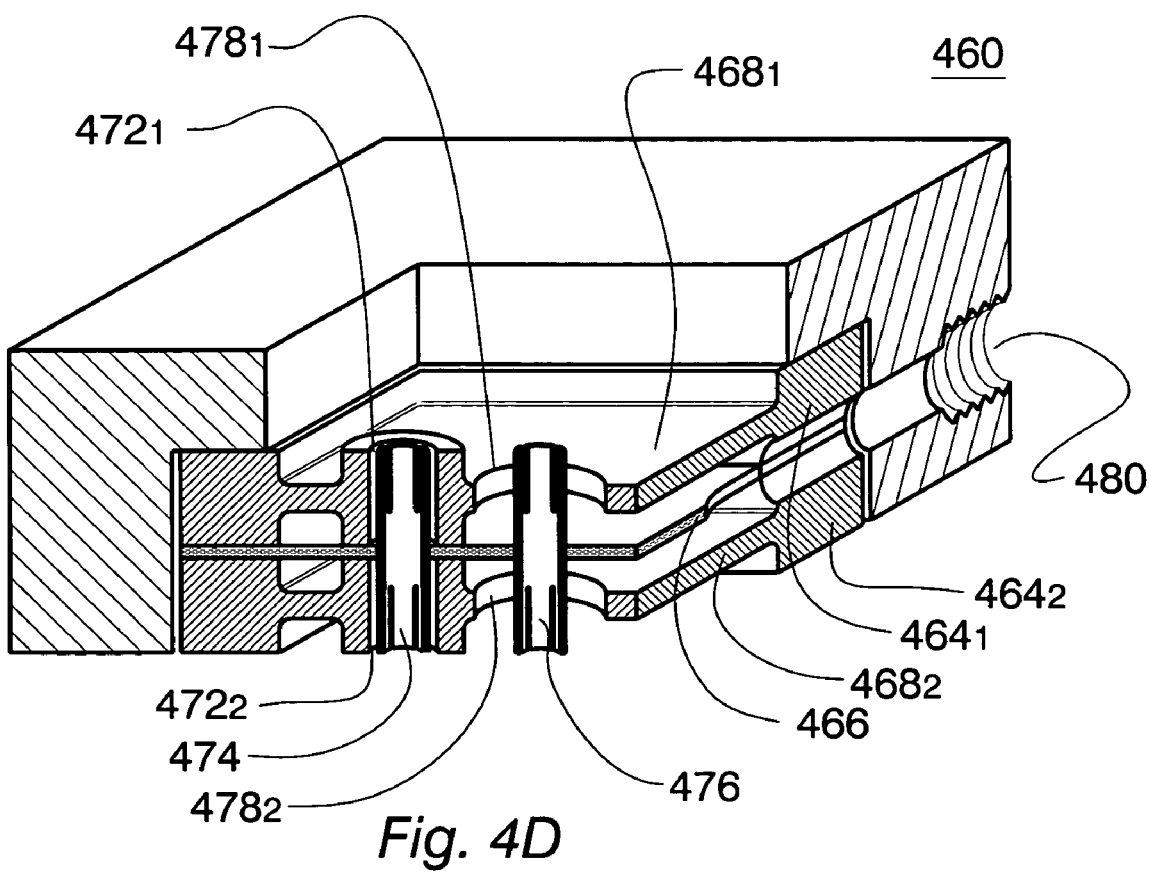
FIG. 4D shows a partial sectional view of a socket that is fabricated in accordance with one or more embodiments of the present invention wherein signal and power/ground contactors comprise tubular connectors inserted into holes through a stack of several contactor holder plates.

In accordance with one or more such embodiments, each of tubular connectors $210_1$-$210_n$ comprises an electrically conductive tube having slots through the tube at each end that extend longitudinally along the tube axis a predetermined distance away from each end (refer to FIGS. 4C and 4D). Further, in accordance with one or more such embodiments, a predetermined number of such slots are disposed about the tube circumference in a configuration that provides a slotted spring useful to engage contacts and/or terminals to which socket 200 may be connected. The number of slots, the disposition of slots about the circumference of a tube, and the length of the slots at each end of the tube may be determined routinely and without undue experimentation by one of ordinary skill in the art to provide a desired force required for connection to, and retention thereof at, a terminal and/or a contact.

As further shown in FIG. 3A, and in accordance with one or more embodiments of the present invention, contactor holder plate 214 is thermally connected to air-cooled, finned heat sink 238. In accordance with one or more such embodiments, heat sink 238 is made of a thermally conductive material such as, for example and without limitation, copper, aluminum alloy 6061, carbon fiber filled polymer, or copper alloy 145, all of which are commonly available. In addition, in accordance with one or more such embodiments, heat sink 238 may be integral with contactor holder plate 214.

In addition, and in accordance with one or more embodiments of the present invention, tubular contactors $210_1$-$210_n$ may be arranged in a pattern of impedance-controlled signal contactors and low impedance power and ground contactors that matches that of terminals and contacts to which socket 200 may be connected. In further addition, as shown in FIG. 3B, and in accordance with one or more embodiments of the present invention, socket 200 may be attached to a DUT board by means of, for example and without limitation, cap head screws (not shown) located in four counter-bored holes $235_1$-$235_4$ in the corners of socket 200.

As shown in FIG. 3A, and in accordance with one or more embodiments of the present invention, contactor holder plate 214 has through holes $220_1$, $220_3$, and $220_5$ of diameter $D_1$ and through holes $220_2$, $220_4$, and $220_n$ of diameter $D_2$; wherein $D_1$ and $D_2$ are different and $D_1 > D_2$. In addition, as further shown in FIG. 3A, each of tube connectors $210_1$-$210_n$ has a body with substantially the same outside diameter. As such, there is a different spacing between the tube bodies of certain ones of tube connectors $210_1$-$210_n$ and their corresponding through holes. As a result, and in accordance with the present invention, this provides a difference in impedance of, and thermal resistance to, contactor holder plate 214 for, certain ones of tube connectors $210_1$-$210_n$.

As further shown in FIG. 3A, each of tube connectors $210_1$-$210_n$ is separated from contactor holder plate 214 by an air gap. In accordance with one or more further such embodiments of the present invention, to further avoid contact between tube connectors $210_1$-$210_n$ and contactor holder plate 214, an inside surface of each through hole in contactor holder plate 214 may be coated with a thin dielectric layer such as, for example and without limitation, Parylene. In accordance with one or more such embodiments, a dielectric layer may extend over all or portions of other surfaces of the contactor holder plate(s).

In accordance with one or more embodiments of the present invention, tube connectors $210_2$, $210_4$, and $210_n$ (having a relatively small space between a side of corresponding through holes and a tube body of these tube connectors) may be used to contact power or ground terminals of a device, and tube connectors $210_1$, $210_3$, and $210_5$ (having a relatively larger space between a side of corresponding through holes and a tube body of these tube connectors) may be used to contact signal terminals of the device.

In accordance with one or more embodiments of the present invention, benefits may be achieved for socket 200 by having a spacing between the tube body of each contactor used to contact power or ground terminals of a device and a surface of their through holes in contactor holder plate 214 that is small. Preferably, a small spacing of about 0.1 mm provides a relatively low thermal resistance between contactors used to contact power or ground terminals and thermally conductive contactor holder plate 214 (when compared with a thermal resistance between contactors used to contact signal terminals and contactor holder plate 214). Advantageously, this results in an enhanced thermal conductivity from power and ground contactors to contactor holder plate 214. Thus, in accordance with the enhanced thermal conductivity provided by socket 200, the amount of current carried by power and ground contactors can be increased.

As one can readily appreciate from FIG. 3A, heat is conducted: (a) through the spacing between each tube connector and its corresponding through hole in contactor holder plate 214 and away from the tube connector; (b) through contactor holder plate 214; and (c) into air-cooled, finned heat sink 238 (refer to FIG. 3B). Also, in accordance with one or more such embodiments, thermal conductivity from a tube connector (used to contact power or ground terminals) to contactor holder plate 214 is high due to a small spacing between a tube body of the tube connector and a corresponding through hole in contactor holder plate 214. As one of ordinary skill in the art can readily appreciate, socket 200 described above in conjunction with FIG. 3A, may also use a fluid cooled cold plate, a convection cooled cold plate, and other heat sinks known in the art instead of heat sink 238.

In accordance with one or more embodiments of the present invention, contactor holder plate 214 may be an electrically conductive metallic plate. Further, certain of the contactors may be used to contact signal terminals on a device. Typically, signal connections through a socket are designed to have an electrical impedance between 20 and 100 ohms, and preferably 50 ohms. To estimate signal contactor electrical impedance, one may use a ratio of a diameter of a through hole in contactor holder plate 214 to an average diameter of a tube body of such contactors used to contact signal terminals disposed in the through hole—taken together with a design of such contactors (for example, a shape of the tube body of such contactors, and electrical properties of such contactors), spacing to nearest neighbor contactors, and effects of various dielectric layers such as dielectric layer 216. In applications where air fills the space in the through holes and the thickness of dielectric layer 216 is negligible with respect to the thickness of metallic contactor holder plate 214, the impedance of a contactor used for signal terminals is given approximately by $Z_S = 60 \ln(D_{signal\ hole}/D_{signal\ body})$. As such, in accordance with one or more embodiments of the present invention, for applications where air fills the space, the diameter of a cylindrical, coaxial through hole ($D_{signal\ hole}$) in contactor holder plate 214 (when configured as a ground shield) is about 2.3 times the diameter of the tube body ($D_{signal\ body}$) of contactors used to contact signal terminals to achieve a signal impedance of 50 ohms.

Further advantages accrue for embodiments wherein contactor holder plate 214 is metallic due to a reduction of impedance of the power and ground spring probes. As is well known to those of ordinary skill in the art, a low impedance contactor is advantageous for making power and ground connections to a high performance device to reduce noise at the power and ground in the device caused by fluctuations in power and ground currents.

To estimate power or ground contactor impedance, one may use a ratio of a diameter of a through hole in contactor holder plate 214 to an average diameter of a tube body of contactors used to contact power or ground terminals disposed in the through hole—taken together with a design of such contactors (for example, a shape of the tube body of such contactors, and electrical properties of such contactors), spacing to nearest neighbor contactors, and effects of various dielectric layers such as dielectric layer 216. In applications where air fills the space in the through holes and contactor holder plate 214 is metallic, the impedance of a contactor used for power or ground terminals is given approximately by $Z_P = 60 \ln(D_{power\ hole}/D_{power\ body})$. In this approximation, $D_{power\ hole}$ is the diameter of the power or ground through hole in contactor holder plate 214, and $D_{power\ body}$ is the average diameter of the body of the power or ground contactor. As such, and in accordance with one or more embodiments of the present invention, the impedance of power and ground contactors is preferably no more than 80 percent of the impedance of signal contactors to provide a significant reduction in power and ground characteristic impedance. In accordance with mathematical formulations for impedance, a requirement that the power contactor characteristic impedance be 80 percent or less than the signal contactor characteristic impedance is approximately satisfied by a mathematical expression: $(D_{signal\ hole}/D_{signal\ body}) \approx 1.18 * (D_{power\ hole}/D_{power\ body})$. Equivalently, the requirement that the power contactor impedance be no greater than 80 percent of the signal contactor impedance is approximately satisfied by a second mathematical expression: $(A_{signal\ hole}/A_{signal\ body}) \approx 1.4 * (A_{power\ hole}/A_{power\ body})$. In this second mathematical expression, $(A_{signal\ hole}/A_{signal\ body})$ is a ratio of the cross sectional area of the through hole for the signal contactor to the cross sectional area of the body of the signal contactor. Correspondingly, $A_{power\ hole}/A_{power\ body}$ is a ratio of the cross sectional area of the through hole for the power or ground contactor to the cross sectional area of the body of the power or ground contactor. Further, for embodiments in which any of the through holes in the holder plates or any of the contactor bodies is not a right circular cylinder, the second mathematical expression is an approximate estimation of the requirement necessary to provide that a power and ground contactor has a characteristic impedance that is 80 percent or less than the characteristic impedance of a signal contactor.

As one can readily appreciate from the above, one or more embodiments of socket 200 that incorporate electrically conductive (for example, metallic) contactor holder plates may provide: (a) well shielded, controlled impedance, contactors for signal terminals (for example an impedance of about 50 ohms); (b) low impedance power or ground contactors; and (c) a thermal conduction path from power or ground contactors to a heat sink. In addition, the controlled impedance together with electrical shielding of adjacent contactors by conductive contactor holder plate 214, provides a high integrity signal path for high performance devices.

In accordance with one or more embodiments of the present invention, tubular connectors $210_1$-$210_n$, are fabricated from electrically conductive metal such as, for example and without limitation, copper, beryllium copper alloys (for example and without limitation, copper alloy 194 that is available from Olin Corporation of Norwalk, Conn.), silver alloys, or stainless steel alloys, and have, for example and without limitation, an inner diameter ("ID") of about 0.45 mm and an outer diameter ("OD") of about 0.55 mm. Further, in accordance with one or more such embodiments, the tube connectors used to contact signal terminals are disposed in through holes having a diameter $D_1$ of about 1.2 mm, and the tube connectors used to contact power or ground terminals are disposed in through holes having a diameter $D_2$ of about 0.65 mm. Still further, in accordance with one or more such embodiments, a grid spacing between contactors is about 1.27 mm. Still further, in accordance with one or more such embodiments, dielectric layer 216 is a polyimide sheet having a thickness of about 50 microns. Yet still further, in accordance with one or more such embodiments, contactor holder plate 214 is an anodized aluminum plate. Advantageously, in accordance with such embodiments, the anodized aluminum layer in the through holes of contactor holder plate 214 prevents tube connectors $210_1$-$210_n$ from making electrical contact with contactor holder plate 214. Further, in accordance with one or more embodiments of the present invention, contactor holder plates may be conformally coated with a film of insulating material by means well known to those of ordinary skill in the art such as, for example and without limitation, chemical vapor deposition, immersion coating, electrodeposition coating, and thermal decomposition coating.

As one of ordinary skill in the art can readily appreciate, further embodiments of the present invention exist wherein through holes are varied in size, and wherein the size of the bodies of tubes are varied in size.

As one of ordinary skill in the art can readily appreciate, in accordance with one or more further embodiments of the present invention, thin dielectric sleeves may be inserted in the through holes in the contactor holder plate (for example and without limitation, by insertion into opposite ends of each through hole) to abut against the sides of the through hole—the thickness of the dielectric sleeve ought to be such that it does not significantly change a desired tube connector impedance (for example, in accordance with one or more embodiments, the dielectric sleeve does not contact a connector body), or if it does not, other parameters discussed herein may have to be adjusted in the manner discussed herein to achieve the desired contactor impedance. In addition, in accordance with one or more such embodiments, dielectric sleeves may be inserted into opposite ends of each through hole, to abut against a conductive ring of a tube connector that has been inserted into the through hole, and thereby, hold the tube connector in place vertically. Further, and in accordance with one or more such embodiments, a contact lubricant (for example and without limitation, a thermally conductive lubricant) or other dielectric fluid may be applied to the space between tube connectors and corresponding holes in the contactor holder plate or plates.

In accordance with one or more embodiments of the present invention, a contactor may have protuberances disposed on a surface of the contactor body that is disposed in a through hole of a contactor holder plate(s). Such protuberances may be in the form of ribs that are useful in holding the contactor by, for example and without limitation, placing dielectric inserts in a through hole above and/or below the protuberance(s). In accordance with one or more such embodiments, the protuberances occupy less than ten (10) percent of the surface area of the contactor body disposed in a through hole.

In accordance with one or more embodiments of the present invention, a cross section of a through hole may be: (a) circular (or substantially circular depending on fabrication tolerances) to form a cylindrical through hole; (b) polygonal; or (c) any other desired shape. Likewise, in accordance with one or more embodiments of the present invention, a cross section of a contactor body disposed in a through hole may have a similar variety of shapes. In such cases, the characteristic impedance of a contactor placed in a through hole may be determined by, among other things, the thickness and material properties of contactor holder plate(s), the cross sectional area of the through hole (for circular or substantially circular cross sections, a diameter may serve as a proxy for the cross sectional area), the cross sectional area of the body of the contactor (for circular or substantially circular body cross sections, a diameter may serve as a proxy for the cross sectional area), the dielectric constant(s) of dielectric material(s) in the through hole, and the thickness and dielectric constant of dielectric sheet(s), if present—as may be calculated using any one of a number of three dimensional field solver algorithms (for example, the IBM Electromagnetic Field Solver Suite of Tools) that are well known to those of ordinary skill in the art. In performing such a calculation, for a through hole having an arbitrary cross section, one may use an average cross sectional area of the through hole, where, for example and without limitation, the average cross sectional area is an average of the cross sectional area of one or more like-sized through holes averaged, for example and without limitation, over a length of the through holes. Thus, for a through hole having a circular or substantially circular cross section, one may use an average diameter of a cross section of the through hole where the average diameter is an average of the diameter for one or more like-sized through holes averaged, for example, over a length of the through holes. Further, in performing such a calculation, for a contactor body having an arbitrary cross section, one may use a maximum cross sectional area of the contactor body, where the maximum cross sectional area excludes any protuberances extending from the contactor body, where such protuberances, for example, occupy less than ten (10) percent of the surface area of the contactor body disposed in the through hole. Thus, for a contactor body having a circular or substantially circular cross section, one may use a maximum diameter of the contactor body where the maximum diameter excludes any protuberances extending from the contactor body, where such protuberances, for example, occupy less than ten (10) percent of the surface area of the contactor body. Alternatively, for a contactor body having an arbitrary cross section, one may use an average cross sectional area of the contactor body where the average cross sectional area excludes any protuberances extending from the contactor body, where such protuberances, for example, occupy less than ten (10) percent of the surface area of the contactor body. Thus, for a contactor body having a circular or substantially circular cross section, one may use a average diameter of the contactor body where the average diameter excludes any protuberances extending from the contactor body, where such protuberances, for example, occupy less than ten (10) percent of the surface area of the contactor body.

In accordance with one or more embodiments of the present invention, contactor holder plates 14 and 18, contactor holder plates 114 and 118, and contactor holder plate 214 may comprise a single sheet (for example, a metallic sheet) or they may be built by stacking layers of thin sheets (for example, metallic sheets) with through holes disposed in an array and aligned to accommodate contactors in the respective through holes. In accordance with one or more such embodiments, contactor holder plates may be made, for example and without limitation, of about 60 micron thick sheets of copper alloy 110 in which an array of through holes is etched by lithographic methods that are well known to those of ordinary skill in the art. In addition, in accordance with one or more further such embodiments, the thin sheets (for example, metallic sheets) may be spaced apart to allow air or other cooling fluid to pass therebetween and to conduct heat away from contactors held in a contactor holder plate comprised of a stack of sheets (for example, metallic sheets). In accordance with one or more such embodiments, if comprised of thin metal sheets, one or more of them may be coated with a thin dielectric layer (wherein such a dielectric layer may extend over all or portions of surfaces of the contactor holder plate(s)) to prevent electrical contact between the metal sheets and contactors inserted in through holes through the stack of sheets.

In accordance with one or more embodiments of the present invention, contactor holder plates may comprise one or more electrically conductive layers and one or more thermally conductive layers. In accordance with one or more such embodiments, electrically conductive layers may comprise a metal such as, for example and without limitation, copper, beryllium-copper, copper alloys, copper plated invar, silver alloys, aluminum, aluminum alloys, and carbon fiber filled polymer. In addition, and in accordance with one or more such embodiments, thermally conductive layers may comprise alumina, aluminum nitride, silicon, silicon carbide and/or a layer having a thermal conductivity of 0.1 Watts/°C.-cm$^2$ or greater.

In accordance with one or more embodiments of the present invention, as shown in FIGS. 2B and 3B, heat sinks 138 and 238, respectively, have fins. In accordance with one or more such embodiments, the fins may include surface protrusions such as, for example and without limitation, an array of pins, and cooling is provided by a flow of air over the fins and surface protrusions. Such an air flow may occur by convective flow.

FIG. 4A shows a partial sectional view of socket 400 that is fabricated in accordance with one or more embodiments of the present invention wherein signal and power/ground contactors comprise spring probes such as signal spring probe $402_1$ and power/ground spring probe $402_2$, respectively. As shown in FIG. 4A, the spring probes are held in through holes in contactor holder plate 408 by dielectric sheets 406 and 412 (for example and without limitation, thin sheets of polyimide) having holes for spring pins of spring probes $402_1$ and $402_2$. In accordance with one or more embodiments of the present invention, contactor holder plate 408 is thermally conductive, and in accordance with one or more further embodiments of the present invention, contactor holder plate 408 is electrically conductive. Lastly, as shown in FIG. 4A, and in accordance with one or more embodiments of the present invention, contactor holder plate 408 is in good thermal contact with thermally conductive holder bracket 414.

FIG. 4B shows a partial sectional view of socket 420 that is fabricated in accordance with one or more embodiments of the present invention wherein signal and power/ground contactors comprise spring probes such as signal spring probe 424 and power/ground spring probe 422, respectively. As shown in FIG. 4B, power and ground spring probes 422 and signal spring probes 424 are held in the centers of through holes $436_1$-$436_4$ and $434_1$-$434_4$, respectively, in a stack of contactor holder plates $426_1$-$426_4$ by holes in thin dielectric sheets 428 and 432 (labels for through holes $436_2$-$436_4$ and through holes $434_2$-$434_4$ are omitted from FIG. 4B for clarity of illustration). In accordance with one or more embodiments of the present invention, one or more of contactor holder plates $426_1$-$426_4$ are thermally conductive, and in accordance with one or more further embodiments of the present invention, one or more of contactor holder plates $426_1$-$426_4$ are electrically conductive. In accordance with one or more such further embodiments of the present invention, one or more of contactor holder plates $426_1$-$426_4$ may be insulated, for example and without limitation, with a thin dielectric coating to prevent electrical shorts to spring probes 422 and 424. In accordance with one or more such further embodiments, the dielectric coating may extend over all or portions of surfaces of the contactor holder plate(s). In accordance with one or more such further embodiments, the insulation for each of contactor holder plates $426_1$-$426_4$ may be provided by a layer of anodized aluminum.

As still further shown in FIG. 4B, and in accordance with one or more embodiments of the present invention, contactor holder plates $426_1$-$426_4$ are stacked and have a spacing between them at thinned sections in a region disposed about through holes $434_1$-$434_4$ that is designed to achieve a characteristic impedance of about fifty (50) ohms for signal spring probe 424. Thus, in accordance with one or more such embodiments, the thickness of contactor holder plates $426_1$-$426_4$ about certain contactors may be different than it is about other contactors to adjust the impedance of certain contactors. In addition, a diameter of through holes $436_1$-$436_4$ for spring probe 422 is smaller than 2.3 times the OD of tube connector 422, as might be the case for certain embodiments wherein a through hole exists in a solid contactor holder plate(s), i.e., a configuration of contactor holder plate(s) not having spacing between contactor holder plates shown in FIG. 4B. In further addition, and in accordance with one or more such embodiments of the present invention, the spacing between contactor holder plates $426_1$-$426_4$ can be filled with air, dielectric coatings on the plates, or by a dielectric layer. In accordance with one or more such embodiments, the dielectric coating or layer may extend over all or portions of surfaces of the contactor holder plate(s). Lastly, in accordance with one or more embodiments of the present invention, and as shown in FIG. 4B, channels $456_1$-$456_4$ in contactor holder plates $426_1$-$426_4$ may be used to circulate a thermal transfer fluid injected into the channels through an aperture (not shown).

FIG. 4C shows a partial sectional view of socket 440 that is fabricated in accordance with one or more embodiments of the present invention wherein signal and power/ground contactors comprise tubular connectors such as signal tubular connector 444 and power/ground tubular connector 442, respectively. As shown in FIG. 4C, tubular connectors 442 and 444 are held in the centers of through holes in a stack of contactor holder plates $446_1$-$446_4$ by dielectric sheet 448. In accordance with one or more embodiments of the present invention, one or more of contactor holder plates $446_1$-$446_4$ are thermally conductive, and in accordance with one or more further embodiments of the present invention, one or more of contactor holder plates $426_1$-$426_4$ are electrically conductive. As further shown in FIG. 4C, and in accordance with one or more such further embodiments of the present invention, contactor holder plates $446_1$-$446_4$ are insulated by a thin dielectric coating to prevent electrical shorts to tubular connectors 442 and 444. In accordance with one or more such further embodiments, the dielectric coating may extend over all or portions of surfaces of the contactor holder plate(s). In accordance with one or more such further embodiments, the insulation for each of contactor holder plates $446_1$-$446_4$ may be provided by a thin, conformal layer of anodized aluminum.

As still further shown in FIG. 4C, and in accordance with one or more 30 embodiments of the present invention, contactor holder plates $446_1$-$446_4$ are stacked and have a spacing between them that is designed to achieve a characteristic impedance of about fifty (50) ohms for tube connector 444. In addition, a diameter of through holes for tube connector 442 is smaller than 2.3 times the OD of tube connector 442, as might be the case for certain embodiments wherein a through hole exists in a solid contactor holder plate(s).

FIG. 4D shows a partial sectional view of socket 460 that is fabricated in accordance with one or more embodiments of the present invention wherein signal and power/ground contactors comprise tubular connectors such as signal tubular connector 476 and power/ground tubular connector 474, respectively. As shown in FIG. 4D, tubular connectors 474 and 476 are held in the centers of through holes in a stack of contactor holder plates $464_1$-$464_2$ by dielectric sheet 466. In accordance with one or more embodiments of the present invention, one or more of contactor holder plates $464_1$-$464_2$ are thermally conductive, and in accordance with one or more further embodiments of the present invention, one or more of contactor holder plates $464_1$-$464_2$ are electrically conductive.

In accordance with one or more such further embodiments of the present invention, contactor holder plates $464_1$-$464_2$ may be insulated to prevent electrical shorts to tubular connector 474 and 476. In accordance with one or more such further embodiments, a dielectric insulation may extend over all or portions of surfaces of the contactor holder plate(s). In accordance with one or more such further embodiments, the insulation for each contactor holder plates $464_1$-$464_2$ may be provided by a thin, conformal layer of anodized aluminum.

As still further shown in FIG. 4D, and in accordance with one or more embodiments of the present invention, contactor holder plates $464_1$-$464_2$ are stacked and have a spacing between them at thinned sections $468_1$ and $468_2$ in a region disposed about tubular connector 476 that is designed to achieve a characteristic impedance of about fifty (50) ohms for tubular connector 476. Thus, in accordance with one or more such embodiments, the thickness of contactor holder plates $464_1$-$464_2$ about certain contactors may be different than it is about other contactors to adjust the impedance of certain contactors. In addition, a diameter of the through hole for tubular connector 474 is smaller than 2.3 times the OD of tubular connector 476, as might be the case for certain embodiments wherein a through hole exists in a solid contactor holder plate(s), i.e., a configuration of contactor holder plate(s) not having spacing between contactor holder plates shown in FIG. 4D. In further addition, and in accordance with one or more such embodiments of the present invention, the spacing between conductive contactor holder plates $464_1$-$464_2$ can be filled with air, dielectric coatings on the plates, or by a dielectric layer. In accordance with one or more such embodiments, the dielectric coatings or layer may extend over all or portions of surfaces of the contactor holder plate(s). Lastly, in accordance with one or more embodiments of the present invention, and as shown in FIG. 4D, channels $486_1$-$486_4$ in contactor holder plates $464_1$-$464_2$ may be used circulate a thermal transfer fluid injected therein through aperture 480.

Figure 5A:
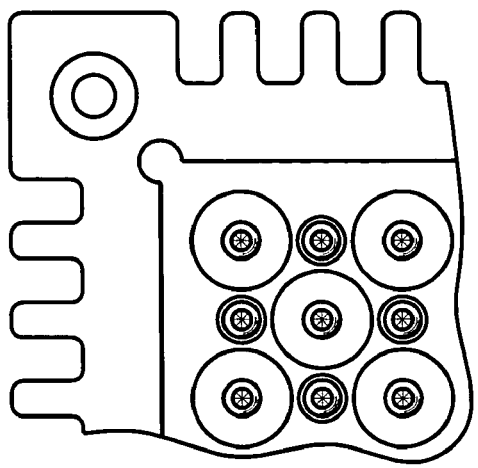
FIGS. 5A-5D show partial top views of sockets that are fabricated in accordance with one or more embodiments of the present invention having various arrangements of signal contactors and power/ground contactors.
Figure 5B:
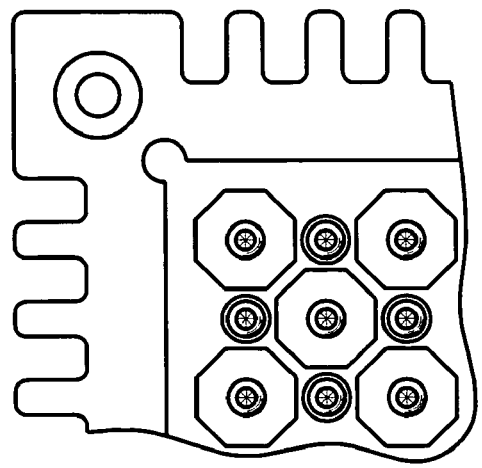
Figure 5C:
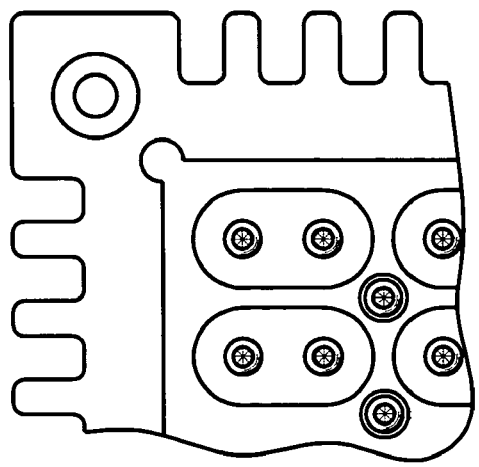
Figure 5D:
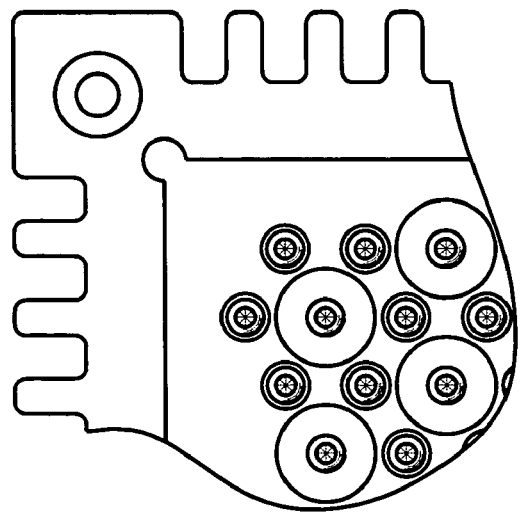

FIGS. 5A-5D show partial top views of sockets 500-530, respectively, that are fabricated in accordance with one or more embodiments of the present invention having various arrangements of signal contacts and power/ground contactors—as shown in these figures, a signal contactor has a relatively larger space between a signal contactor body and its corresponding through hole than that between a power/ground contactor body and its corresponding through hole. FIG. 5A shows socket 500 wherein contactors are arranged in a square array with alternating signal and power/ground contactors. This arrangement enables a closer spacing than an arrangement in which signal contactors are directly adjacent. FIG. 5B shows socket 510 having the same arrangement as socket 500 shown in FIG. 5A. However, the through holes for the contactor holder plate of socket 510 for signal contactors are polygonal to provide a higher signal impedance than can be obtained with a circular, cylindrical hole. FIG. 5C shows socket 520 wherein two signal contactors are disposed in the same through hole where they are arranged in a pair for differential signaling applications. Lastly, FIG. 5D shows socket 530 wherein signal contactors and power/ground contactors are arranged in an alternating hexagonal pattern.

Figure 6A:
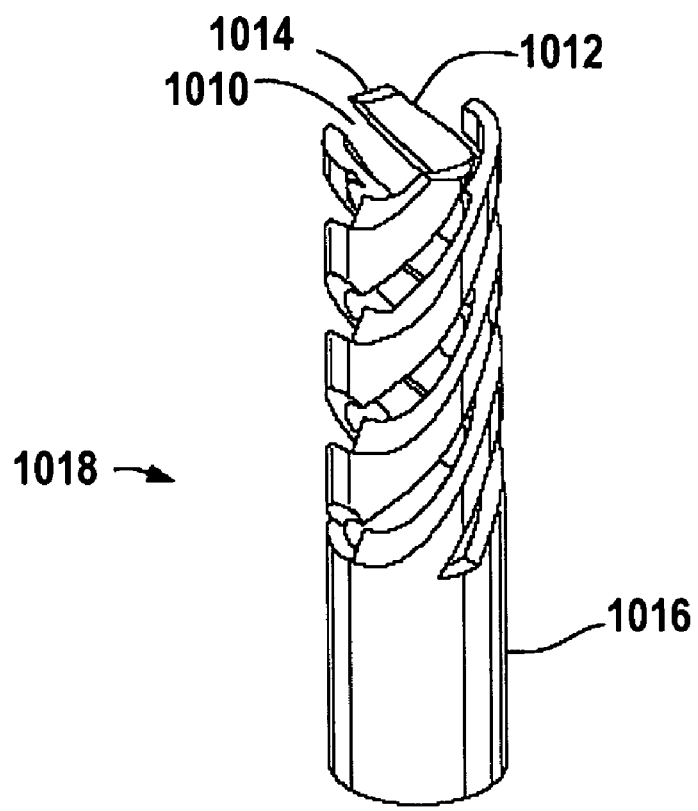
FIGS. 6A and 6B are perspective views of contactors having prongs adapted to grip a terminal bump that may be used to fabricate embodiments of the present invention.
Figure 6B:
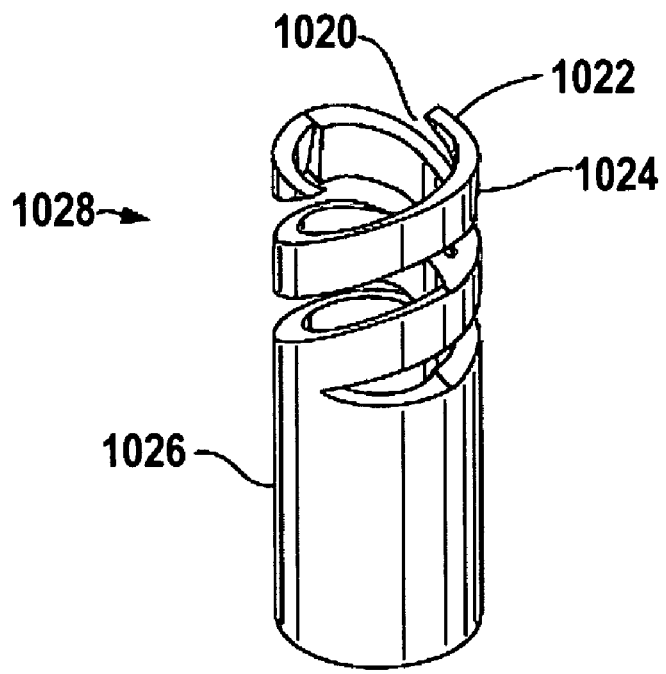

FIGS. 6A and 6B are perspective views of tubular contactors 18 and 28 having prongs adapted to grip a terminal bump that may be used to fabricate embodiments of the present invention. As shown in FIG. 6A, tubular contactor 1018 comprises a cylindrical metal tube that is cut through by helical groves 1010 to form four prongs 1012 terminated in four tips 1014. Prongs 1012 are attached to, and held in place by, cylindrical collar 1016, and are adapted to grip a cylindrical post inserted along a longitudinal axis of tubular contactor 1018. In accordance with one embodiment, tubular contactor 1018 is made from a 304 stainless steel tube having a 0.44 mm inner diameter and a 0.55 mm outer diameter that is available from K-tube Corporation of Poway, Calif. Four helical grooves 1010 are cut in 0.02 mm wide cut lines along a 0.75 mm length of the tube using a Nd-YAG laser. Grooves 1010 are cut at an angle of 35° with respect to a circumference of tube 1016. The laser cut tube may be plated with a 0.004 mm thick layer of nickel and a 0.002 mm thick layer of soft gold to form a conductive surface for contacting a bump. This embodiment of tubular contactor 1018 is adapted to connect with a 0.5 mm metal ball. In accordance with one or more such embodiments, the ball is a steel ball plated with a flash of nickel and 0.002 mm of soft gold. A force of 20 gf is sufficient to insert the 0.5 mm diameter metal ball into the contactor and to provide a contact resistance of about 0.018 ohms. Once engaged, the ball is held in place by the contactor without need of a clamp or other mechanical holder.

In accordance with one or more embodiments of the present invention, the thickness of the tubing material of the contactor may be selected to supply a predetermined insertion force for insertion of a bump into the contactor, and is preferably between 2% and 20% of the inner diameter of the tube. As one of ordinary skill in the art can readily appreciate, the thickness and material of the cylindrical tube may vary depending upon requirements of a particular application. For example and without limitation, the material may be selected from one or more of, for example and without limitation, stainless steel of various types, tempered steels, beryllium copper, phosphor bronze, copper alloys of various types, nickel tungsten alloys, nickel chromium alloys, nickel manganese, nickel binary and ternary alloys, titanium alloys, Nitinol, and other spring materials. In addition, the contactor may be plated with copper, nickel, cobalt, palladium, gold, alloys thereof as well as other conductive films. In accordance with one or more embodiments, a connector lubricant may be applied to a surface of the prongs of the contactor.

Although tubular contactor 1018 has four prongs 1012, it should be clear to one of ordinary skill in the art that further embodiments of the contactor may incorporate any number of prongs. For example, contactor 1028 shown in FIG. 6B has two prongs 1024 with distal ends ending in tips 1022 and with proximal ends attached to cylindrical collar 1026. Prongs 1024 may be formed by cutting helical grooves through a wall of a cylindrical tube. The insertion force for mating a bump with contactor 1028 depends upon an angle of cut line 1020, which angle is preferably between 10 and 70 degrees. In accordance with one or more further embodiments of the present invention, the angle of cut line 1020 may be varied with axial distance along contactor 1028. For example and without limitation, in accordance with one or more such embodiments: (a) the sense of the angle of the helical cut may be alternated from positive to negative to reduce self inductance of the contactor; or (b) the sense of the line may be varied over an axial distance to produce a serpentine cut line. In addition, in accordance with one or more further embodiments of the present invention, cut line 1020 may vary in width along the axial length of the cut.

In addition, as one of ordinary skill in the art will readily appreciate, embodiments of the present invention may be fabricated by utilizing, for example and without limitation, laser cutting of tubular material, plasma etching of tubular material, pattern etching of tubular material, pattern plating of tubular material, layer plating of tubular material, LIGA plating, and combinations thereof. The tubing of the contactor is typically a cylinder of circular, oblong, square, or polygonal cross section. In accordance with one or more further embodiments, the contactor may be fabricated as part of a substrate carrier structure. In addition, laser annealing, flash annealing, ion beam treatment, pickling, quenching, heat treating and other treatments that are well known in the art may be used to improve spring properties of the contactor.

Figure 7C:
FIGS. 7A, 7B and 7C are perspective views of double-ended contactors having prongs adapted to grip a terminal bump that may be used to fabricate embodiments of the present invention.
Figure 7B:
Figure 7A:

FIGS. 7A, 7B and 7C show embodiments of a contactor in which a bottom end may be equivalent to a top end in that the mechanical force needed to mate the top end of the contactor to a terminal bump is substantially the same as the mechanical force needed to mate the bottom end to a similar terminal bump. In accordance with one or more such embodiments, a variety of prong shapes may provide equivalent mating forces to a bump. For example, FIG. 7A shows a double ended contactor in which four prongs on each end form a right handed helix. FIG. 7B shows a double ended contactor in which four prongs on the top end form a right handed helix and four prongs on the bottom end form a left handed helix. FIG. 7C shows a double ended contactor in which four prongs on the top end and four prongs on the bottom end form an angle with a longitudinal axis of the contactor that varies with distance along the axis to form a zigzag pattern. One of ordinary skill in the art will readily appreciate that a double-ended contactor may be fabricated in accordance with one or more embodiments wherein ends are mechanically equivalent. For example, in certain applications it is desirable that one end of a contactor remain firmly attached to a mating bump while the opposite end is easily disengaged from its mating bump.

One of ordinary skill in the art will readily appreciate that the materials and fabrication techniques described above with respect to tubular connectors 1018 and 1028 may be used to fabricate tubular connectors described above in conjunction with FIGS. 3A, 4C and 4D.

Further embodiments of the present invention may be fabricated wherein, for through holes having substantially circular cross sections and contactor bodies having substantially circular cross sections, $(D_{signal\ hole}/D_{signal\ body})>1.18*(D_{power\ hole}/D_{power\ body})$, where: (a) $D_{signal\ hole}$ is a diameter of a through hole for a signal contactor; (b) $D_{signal\ body}$ is a diameter of a contactor body for a signal contactor; (c) $D_{power\ hole}$ is a diameter of a through hole for power or ground contactor; and (d) $D_{power\ body}$ is a diameter of a contactor body for a power or ground terminal contactor. In addition, still further embodiments exist wherein: (a) the signal contactor through hole cross sectional area is an average signal contactor through hole cross sectional area over a length of one or more signal contactor through holes (and the average signal contactor through hole cross section is substantially circular with diameter $D_{av-signal\ hole}$); (b) the signal contactor body cross sectional area is a maximum signal contactor body cross sectional area of one or more signal contactors (and the maximum signal contactor body cross section is substantially circular with diameter $D_{max-signal\ body}$); (c) the power or ground contactor through hole cross sectional area is an average power or ground contactor through hole cross sectional area over a length of one or more power or ground through holes (and the average power or ground contactor through hole cross section is substantially circular with diameter $D_{av-power\ hole}$); (d) the power or ground contactor body cross sectional area is a maximum power or ground contactor body cross sectional area of one or more power or ground contactors (and the maximum power or ground contactor body cross section is substantially circular with diameter $D_{max-power\ body}$); and (e) $(D_{av-signal\ hole}/D_{max-signal\ body})>1.18*(D_{av-power\ hole}/D_{max-power\ body})$.

Further embodiments of the present invention may be fabricated wherein $(A_{signal\ hole}/A_{signal\ body})>1.4*(A_{power\ hole}/A_{power\ body})$, where: (a) $A_{signal\ hole}$ is a cross sectional area of a through hole for a signal contactor; (b) $A_{signal\ body}$ is a cross sectional area of a contactor body for a signal contactor; (c) $A_{power\ hole}$ is a cross sectional area of a through hole for power or ground contactor; and (d) $A_{power\ body}$ is a cross sectional area of a contactor body for a power or ground terminal contactor. In embodiments wherein a cross sectional area of a through hole or a cross sectional area of a contactor body varies with distance along an axis of the contactor (for example, along a longitudinal axis), the ratio $A_{contactor\ body}/A_{through\ ole}$ may be estimated to be an average of a ratio $A_{contactor\ body}/A_{through\ ole}$ as measured along the axis of the contactor (for example, a longitudinal axis).

As has been described above, one or more embodiments of the present invention may be fabricated wherein one or more power and/or ground contactors are disposed in one or more through holes in one or more contactor plates to provide a predetermined thermal conductivity between the one or more power and/or ground contactors and one or more of the one or more contactor holder plates. Further, in accordance with one or more further such embodiments, one or more signal contactors are disposed in one or more through holes in the one or more contactor plates to provide a predetermined characteristic impedance. Still further, in accordance with one or more still further such embodiments, the characteristic impedance of the power and/or ground contactors may be a predetermined fraction of the characteristic impedance of the signal contactors (for example and without limitation, less than 80%). As has been discussed above, the characteristic impedance of a contactor may be adjusted, among other things, by adjusting a thickness of contactor holder plates disposed thereabout. Hence, one or more embodiments of the present invention may have: (a) a cross sectional area of one or more through holes for one or more power and/or ground contactors be the same or about the same as a cross sectional area of one or more through holes for one or more signal contactors; and (b) a cross sectional area of a body of the one or more power and/or ground contactors may be same or about the same as a cross sectional area of a body of the one or more signal contactors; however, the thickness of one or more of the one or more contactor holder plates in a region about the one or more signal contactors may be adjusted to provide a predetermined characteristic impedance—for example, such thickness may be different from the thickness of the one or more of the one or more contactor holder plates in a region about the one or more power and/ground contactors.

As one of ordinary skill in the art can readily appreciate from the above, one or more further embodiments of the present invention may be fabricated (for example and without limitation, from one or more of the above-described embodiments) wherein top and/or bottom ends of contactor bodies are disposed in through holes so that they extend beyond: (a) top and/or bottom surfaces of one or more (or all) of the contactor holder plate(s); and/or (b) top and/or bottom surfaces of any dielectric sheets between which contactor holder plate(s) may be disposed.

As one of ordinary skill in the art can readily appreciate, in accordance with many of the above-described embodiments, the contactor bodies do not contact the contactor holder plate(s). Further, in accordance with many of such above-described embodiments, protuberances on the contactor bodies do not contact the contactor holder plate(s).

Embodiments of the present invention described above are exemplary. As such, many changes and modifications may be made to the disclosure set forth above while remaining within the scope of the invention. In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. Further, as is apparent to one skilled in the art, the embodiments may be used for making connections to semiconductor devices, electronic devices, electronic subsystems, cables, and circuit boards and assemblies.

As one or ordinary skill in the art will readily appreciate, sockets fabricated in accordance with one or more embodiments of the present invention may include any number of fluid seals, gaskets, adhesives, washers, or other elements that function to seal the assembly and to prevent thermal transfer fluid from leaking (internally or externally).

The scope of the invention should be determined with reference to the appended claims along with their full scope of equivalents.

What is claimed is:

1. A socket useful to contact an electronic device, the socket comprising:
    a structure comprised of one or more metallic contactor holder plates, the structure including one or more first through holes having a first hole cross sectional area, and one or more second through holes having a second hole cross sectional area, which one or more first through holes and one or more second through holes extend through each of the one or more metallic contactor holder plates of the structure;
    one or more first contactors having a body with a first body cross sectional area, which body is disposed in the first through holes;
    one or more second contactors having a body with a second body cross sectional area, which body is disposed in the second through holes; and
    a heat sink in thermal contact with one or more of the one or more contactor holder plates;
    wherein:
    the first hole cross sectional area is an average first hole cross sectional area over a length of the one or more first through holes;
    the second hole cross sectional area is an average second hole cross sectional area over a length of the one or more second through holes;
    the first body cross sectional area is one of an average or a maximum first body cross sectional area over a length of the body of the one or more first contactors;
    the second body cross sectional area is one of an average or a maximum second body cross sectional area over a length of the body of the one or more second contactors; and
    a first ratio of the first hole cross sectional area to the first body cross sectional area is different from a second ratio of the second hole cross sectional area to the second body cross sectional area.

2. The socket of claim 1 wherein the first body cross sectional area is the same as the second body cross sectional area.

3. The socket of claim 1 wherein the first hole cross sectional area is the same as the second hole cross sectional area.

4. The socket of claim 1 wherein the first hole cross sectional area is different from the second hole cross sectional area, and the first body cross sectional area is different from the second body cross sectional area.

5. The socket of claim 1 wherein one or more of the one or more metallic contactor holder plates is made of one or more of copper, bronze, a copper alloy, a copper plated nickel-iron alloy, a silver alloy, aluminum, or an aluminum alloy.

6. The socket of claim 1 wherein the heat sink includes channels adapted to direct a thermal transfer fluid therethrough.

7. The socket of claim 6 wherein the thermal transfer fluid is a liquid.

8. The socket of claim 7 wherein the liquid is one or more of water, water-glycol mixtures, Fluorinert, or Galden®.

9. The socket of claim 6 wherein the thermal transfer fluid is a gas.

10. The socket of claim 9 wherein the gas is one or more of compressed air, air, nitrogen, and helium.

11. The socket of claim 1 wherein one or more of the contactors is a spring probe.

12. The socket of claim 11 where the spring probe is a Pogo® spring contact.

13. The socket of claim 1 wherein one or more of the contactors is a tubular connector.

14. The socket of claim 1 wherein the heat sink is integral with one or more of the contactor holder plates.

15. The socket of claim 1 wherein the heat sink is adapted to transfer heat to a flow of air.

16. The socket of claim 15 wherein the flow of air is convective flow.

17. The socket of claim 16 wherein the heat sink includes surface protrusions.

18. The socket of claim 1 wherein:
    the average or the maximum first body cross sectional area excludes protuberances extending from the first contactors that occupy less than 10 percent of a surface area of the first contactor body; and
    the average or the maximum second body cross sectional area excludes protuberances extending from the second contactors that occupy less than 10 percent of a surface area of the first contactor body.

19. The socket of claim 1 wherein:
    the first hole cross section, the first body cross section, the second hole cross section, the second body cross section are substantially circular; and
    a first ratio of a diameter of the first hole cross section to a diameter of the first body cross section is more than 1.18 times a second ratio of a diameter of the second hole cross section to a diameter of the second body cross section.

20. The socket of claim 19 wherein the first ratio is about 2.3 and the second ratio is less than 2.

21. The socket of claim 1 wherein:
    an average first hole cross section corresponding to the average first hole cross sectional area, a maximum first body cross section corresponding to the maximum first body cross sectional area, an average second hole cross section corresponding to the average second hole cross sectional area, and a maximum second body cross section corresponding to the maximum second body cross sectional area are substantially circular; and
    a first ratio of a diameter of the average first hole cross section to a diameter of the maximum first body cross section is more than 1.18 times a second ratio of a diameter of the average second hole cross section to a diameter of the maximum second body cross section.

22. The socket of claim 21 wherein the first ratio is about 2.3 and the second ratio is less than 2.

23. The socket of claim 1 further comprising:
one or more dielectric materials disposed between one or more of the contactor holder plates.

24. The socket of claim 1 further comprising:
dielectric material disposed on a surface of one or more of the one or more through holes.

25. The socket of claim 1 further comprising:
a top dielectric layer disposed over the one or more contactor plates, and a bottom dielectric layer disposed under the one or more contactor plates, the top dielectric layer and the bottom dielectric layers having through holes through which a portion of the first contactors and second contactors is disposed.

26. The socket of claim 1 wherein one or more of the one or more contactor holder plates have a first thickness in a first region disposed about one or more of the one or more first through holes and a second thickness in a second region disposed about one or more of the one or more second through holes, and the first thickness is different from the second thickness.

27. The socket of claim 1 wherein two of the one or more first contactors are disposed in one of the one or more first through holes.

28. A socket useful to contact an electronic device, the socket comprising:
a structure comprised of one or more metallic contactor holder plates, the structure including one or more first through holes having a first hole cross sectional area, and one or more second through holes having a second hole cross sectional area, which one or more first through holes and one or more second through holes extend through each of the one or more contactor holder plates of the structure;
one or more first contactors having a body with a first body cross sectional area, which body is disposed in the first through holes;
one or more second contactors having a body with a second body cross sectional area, which body is disposed in the second through holes; and
a heat sink in thermal contact with one or more of the one or more contactor holder plates;
wherein;
the first hole cross sectional area is an average first hole cross sectional area over a length of the one or more first through holes;
the second hole cross sectional area is an average second hole cross sectional area over a length of the one or more second through holes;
the first body cross sectional area is one of an average or a maximum first body cross sectional area over a length of the body of the one or more first contactors;
the second body cross sectional area is one of an average or a maximum second body cross sectional area over a length of the body of the one or more second contactors;
a first ratio of the first hole cross sectional area to the first body cross sectional area is different from a second ratio of the second hole cross sectional area to the second body cross sectional area; and
an aperture is provided for introduction of thermal transfer fluid between two or more of the contactor holder plates.

29. A socket useful to contact an electronic device, the socket comprising:
a structure comprised of one or more electrically conductive contactor holder plates, the structure including one or more first through holes having a first hole cross sectional area, and one or more second through holes having a second hole cross sectional area, which one or more first through holes and one or more second through holes extend through each of the one or more contactor holder plates of the structure;
one or more first contactors having a body with a first body cross sectional area, which body is disposed in the first through holes;
one or more second contactors having a body with a second body cross sectional area, which body is disposed in the second through holes; and
a heat sink in thermal contact with one or more of the one or more contactor holder plates;
wherein:
the first hole cross sectional area is an average first hole cross sectional area over a length of the one or more first through holes;
the second hole cross sectional area is an average second hole cross sectional area over a length of the one or more second through holes;
the first body cross sectional area is one of an average or a maximum first body cross sectional area over a length of the body of the one or more first contactors;
the second body cross sectional area is one of an average or a maximum second body cross sectional area over a length of the body of the one or more second contactors; and
a ratio of the first hole cross sectional area to the first body cross sectional area is greater than 1.4 times a ratio of the second hole cross sectional area to the second body cross sectional area.

30. The socket of claim 29 wherein one or more of the one or more contactor holder plates have a first thickness in a first region disposed about one or more of first through holes and a second thickness in a second region disposed about one or more of the one or more second through holes, and the first thickness is different from the second thickness.

31. The socket of claim 29 wherein two of the one or more first contactors are disposed in one of the one or more first through holes.

32. The socket of claim 29 wherein:
the average or the maximum first body cross sectional area excludes protuberances extending from the first contactors that occupy less than 10 percent of a surface area of the first contactor body; and
the average or the maximum second body cross sectional area excludes protuberances extending from the second contactors that occupy less than 10 percent of a surface area of the first contactor body.

33. The socket of claim 29 further comprising:
one or more dielectric materials disposed between one or more of the contactor holder plates.

34. The socket of claim 29 further comprising:
dielectric material disposed on a surface of one or more of the one or more through holes.

35. The socket of claim 29 further comprising:
a top dielectric layer disposed over the one or more contactor plates, and a bottom dielectric layer disposed under the one or more contactor plates, the top dielectric layer and the bottom dielectric layers having through holes through which a portion of the first contactors and second contactors is disposed.

36. A socket useful to contact an electronic device, the socket comprising:
a structure comprised of one or more electrically conductive contactor holder plates, the structure including one or more first through holes having a first hole cross sectional area, and one or more second through holes having a second hole cross sectional area, which one or more first through holes and one or more second through holes extend through each of the one or more contactor holder plates of the structure;

one or more first contactors having a body with a first body cross sectional area, which body is disposed in the first through holes;

one or more second contactors having a body with a second body cross sectional area, which body is disposed in the second through holes; and wherein:

the first hole cross sectional area is an average first hole cross sectional area over a length of the one or more first through holes;

the second hole cross sectional area is an average second hole cross sectional area over a length of the one or more second through holes;

the first body cross sectional area is one of an average or a maximum first body cross sectional area over a length of the body of the one or more first contactors;

the second body cross sectional area is one of an average or a maximum second body cross sectional area over a length of the body of the one or more second contactors;

a ratio of the first hole cross sectional area to the first body cross sectional area is greater than 1.4 times a ratio of the second hole cross sectional area to the second body cross sectional area; and an aperture is provided for introduction of thermal transfer fluid between two or more of the contactor holder plates.

37. The socket of claim 29 wherein the first body cross sectional area is the same as the second body cross sectional area.

38. The socket of claim 29 wherein the first hole cross sectional area is the same as the second hole cross sectional area.

39. The socket of claim 29 wherein the first hole cross sectional area is different from the second hole cross sectional area, and the first body cross sectional area is different from the second body cross sectional area.

40. The socket of claim 29 wherein one or more of the contactors is a spring probe.

41. The socket of claim 29 wherein one or more of the contactors is a tubular connector.

42. A socket useful to contact an electronic device, the socket comprising:

a structure comprised of one or more metallic contactor holder plates, the structure including one or more first through holes having a first hole cross sectional area, and one or more second through holes having a second hole cross sectional area, which one or more first through holes and one or more second through holes extend through each of the one or more contactor holder plates of the structure;

one or more first contactors having a body with a first body cross sectional area, which body is disposed in the first through holes;

one or more second contactors having a body with a second body cross sectional area, which body is disposed in the second through holes; and a heat sink in thermal contact with one or more of the one or more contactor holder plates;

wherein:

the first hole cross sectional area is an average first hole cross sectional area over a length of the one or more first through holes;

the second hole cross sectional area is an average second hole cross sectional area over a length of the one or more second through holes;

the first body cross sectional area is one of an average or a maximum first body cross sectional area over a length of the body of the one or more first contactors;

the second body cross sectional area is one of an average or a maximum second body cross sectional area over a length of the body of the one or more second contactors;

the body of the one or more first contactors does not contact the one or more contactor holder plates; and the body of the one or more second contactors does not contact the one or more contactor holder plates.

43. The socket of claim 42 wherein the first hole cross sectional area is different from the second hole cross sectional area.

44. The socket of claim 43 wherein the first body cross sectional area is the same as the second body cross sectional area.

45. The socket of claim 42 wherein the first hole cross sectional area is the same as the second hole cross sectional area.

46. The socket of claim 45 wherein the first body cross sectional area is different from the second body cross sectional area.

47. The socket of claim 42 wherein the first hole cross sectional area is different from the second hole cross sectional area, and the first body cross sectional area is different from the second body cross sectional area.

48. The socket of claim 42 wherein one or more of the one or more metallic contactor holder plates is made of one or more of copper, bronze, a copper alloy, a copper plated nickel-iron alloy, a silver alloy, aluminum, or an aluminum alloy.

49. The socket of claim 42 further comprising:

one or more dielectric materials disposed between one or more of the contactor holder plates.

50. The socket of claim 42 further comprising:

dielectric material disposed on a surface of one or more of the one or more through holes.

51. The socket of claim 42 further comprising:

a top dielectric layer disposed over the one or more contactor plates, and a bottom dielectric layer disposed under the one or more contactor plates, the top dielectric layer and the bottom dielectric layers having through holes through which a portion of the first contactors and second contactors is disposed.

52. A socket useful to contact an electronic device, the socket comprising:

a structure comprised of one or more contactor holder plates, structure including one or more first through holes having a first hole cross sectional area, and one or more second through holes having a second hole cross sectional area, which one or more first through holes and one or more second through holes extend through each of the one or more contactor holder plates of the structure;

one or more first contactors having a body with a first body cross sectional area, which body is disposed in the first through holes;

one or more second contactors having a body with a second body cross sectional area, which body is disposed in the second through holes; and a heat sink in thermal contact with one or more of the one or more contactor holder plates;

wherein:
the first hole cross sectional area is an average first hole cross sectional area over a length of the one or more first through holes;
the second hole cross sectional area is an average second hole cross sectional area over a length of the one or more second through holes;
the first body cross sectional area is one of an average or a maximum first body cross sectional area over a length of the body of the one or more first contactors;
the second body cross sectional area is one of an average or a maximum second body cross sectional area over a length of the body of the one or more second contactors;
the body of the one or more first contactors does not contact the one or more contactor holder plates;
the body of the one or more second contactors does not contact the one or more contactor holder plates; and
an aperture is provided for introduction of thermal transfer fluid between two or more of the contactor holder plates.

53. A socket useful to contact an electronic device, the socket comprising:
a structure comprised of one or more metallic contactor holder plates, the structure including one or more first through holes having a first hole cross sectional area, and one or more second through holes having a second hole cross sectional area, which one or more first through holes and one or more second through holes extend through each of the one or more contactor holder plates of the structure;
one or more first contactors having a body with a first body cross sectional area, which body is disposed in the first through holes;
one or more second contactors having a body with a second body cross sectional area, which body is disposed in the second through holes; and
a heat sink in thermal contact with one or more of the one or more contactor holder plates;
wherein:
the first hole cross sectional area is an average first hole cross sectional area over a length of the one or more first through holes;
the second hole cross sectional area is an average second hole cross sectional area over a length of the one or more second through holes;
the first body cross sectional area is one of an average or a maximum first body cross sectional area over a length of the body of the one or more first contactors;
the second body cross sectional area is one of an average or a maximum second body cross sectional area over a length of the body of the one or more second contactors; and
the first hole cross sectional area is different from the second hole cross sectional area.

54. The socket of claim 53 wherein the first body cross sectional area is different from the second body cross sectional area.

55. A socket useful to contact an electronic device, the socket comprising:
a structure comprised of one or more metallic contactor holder plates, the structure including one or more first through holes having a first hole cross sectional area, and one or more second through holes having a second hole cross sectional area, which one or more first through holes and one or more second through holes extend through each of the one or more contactor holder plates of the structure;
one or more first contactors having a body with a first body cross sectional area, which body is disposed in the first through holes;
one or more second contactors having a body with a second body cross sectional area, which body is disposed in the second through holes; and
a heat sink in thermal contact with one or more of the one or more contactor holder plates;
wherein:
the first hole cross sectional area is an average first hole cross sectional area over a length of the one or more first through holes;
the second hole cross sectional area is an average second hole cross sectional area over a length of the one or more second through holes;
the first body cross sectional area is one of an average or a maximum first body cross sectional area over a length of the body of the one or more first contactors;
the second body cross sectional area is one of an average or a maximum second body cross sectional area over a length of the body of the one or more second contactors; and
the first body cross sectional area is different from the second body cross sectional area.

56. The socket of claim 55 wherein the first hole cross sectional area is different from the second hole cross sectional area.

57. A socket useful to contact an electronic device, the socket comprising:
a structure comprised of one or more metallic contactor holder plates, the structure including one or more first through holes having a first hole cross sectional area, and one or more second through holes having a second hole cross sectional area, which one or more first through holes and one or more second through holes extend through each of the one or more contactor holder plates of the structure;
one or more first contactors having a body with a first body cross sectional area, which body is disposed in the first through holes;
one or more second contactors having a body with a second body cross sectional area, which body is disposed in the second through holes; and
a heat sink in thermal contact with one or more of the one or more contactor holder plates;
wherein:
the first hole cross sectional area is an average first hole cross sectional area over a length of the one or more first through holes;
the second hole cross sectional area is an average second hole cross sectional area over a length of the one or more second through holes;
the first body cross sectional area is one of an average or a maximum first body cross sectional area over a length of the body of the one or more first contactors;
the second body cross sectional area is one of an average or a maximum second body cross sectional area over a length of the body of the one or more second contactors; and
one or more of the one or more contactor holder plates have a first thickness in a first region disposed about one or more of the first through holes and a second thickness in a second region disposed about one or more of the second through holes, and the first thickness is different from the second thickness.

58. The socket of claim 57 wherein the first body cross sectional area is the same as the second body cross sectional area.

59. The socket of claim 57 wherein the first hole cross sectional area is the same as the second hole cross sectional area.

60. The socket of claim 57 wherein the first hole cross sectional area is different from the second hole cross sectional area, and the first body cross sectional area is different from the second body cross sectional area.

61. The socket of claim 57 wherein one or more of the contactors is a spring probe.

62. The socket of claim 57 wherein one or more of the contactors is a tubular connector.

63. The socket of claim 57 wherein:
  one or more of the one or more first contactors have a first characteristic impedance;
  one or more of the one or more second contactors have a second characteristic impedance; and
  the second characteristic impedance is no greater 80 percent of the first characteristic impedance.

64. A socket useful to contact an electronic device, the socket comprising:

a structure comprised of one or more electrically conductive contactor holder plates, the structure including one or more first through holes, and one or more second through holes, which one or more first through holes and one or more second through holes extend through each of the one or more contactor holder plates of the structure;
  one or more first contactors are disposed in the first through holes;
  one or more second contactors are disposed in the second through holes; and
  a heat sink in thermal contact with one or more of the one or more contactor holder plates;
  wherein:
  one or more of the one or more first contactors have a first characteristic impedance;
  one or more of the one or more second contactors have a second characteristic impedance; and
  the second characteristic impedance is no greater 80 percent of the first characteristic impedance.

* * * * *